(12) United States Patent
Ohbuchi et al.

US006971050B1

(10) Patent No.: US 6,971,050 B1
(45) Date of Patent: Nov. 29, 2005

(54) INTERLEAVING METHOD AND APPARATUS, DE-INTERLEAVING METHOD AND APPARATUS, AND INTERLEAVING/DE-INTERLEAVING SYSTEM AND APPARATUS

(75) Inventors: Kazuhisa Ohbuchi, Kawasaki (JP); Takaharu Nakamura, Kawasaki (JP); Kazuo Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/301,853

(22) Filed: Apr. 29, 1999

(30) Foreign Application Priority Data

Oct. 30, 1998 (JP) .......................................... 10-311512

(51) Int. Cl.[7] ............................................... G06F 11/00
(52) U.S. Cl. ......................... 714/701; 714/761; 714/787
(58) Field of Search .................................. 714/701, 792, 714/787, 761, 769, 771, 752, 755, 760, 776, 801, 739, 784, 702; 345/63, 68, 692, 419; 455/277.1, 277.2, 278.1; 379/172; 375/262, 264, 265, 350, 220, 332; 360/45; 704/272; 380/275, 33, 268, 216; 369/275.3; 370/345.65, 355, 389, 461; 341/81, 51, 61; 358/353; 708/254, 313; 382/253; 711/200, 202; 713/179; 712/7, 20; 348/441; 386/48

(56) References Cited

U.S. PATENT DOCUMENTS

| | | | | |
|---|---|---|---|---|
| 4,217,660 A | * | 8/1980 | En ............................. | 714/787 |
| 4,394,642 A | | 7/1983 | Currie et al. | |
| 4,959,863 A | * | 9/1990 | Azuma et al. ............... | 704/272 |
| 5,040,211 A | * | 8/1991 | Schreiber .................... | 380/214 |
| 5,068,878 A | * | 11/1991 | Lin et al. .................... | 375/362 |
| 5,204,981 A | * | 4/1993 | Karasawa et al. ....... | 455/277.1 |
| 5,870,471 A | * | 2/1999 | Wootton et al. ............ | 713/179 |
| 6,151,001 A | * | 11/2000 | Anderson et al. ............. | 345/63 |

FOREIGN PATENT DOCUMENTS

| | | |
|---|---|---|
| EP | 0 486 729 | 1/1996 |
| GB | 2 318 034 | 4/1998 |
| JP | 6-216882 | 8/1994 |
| JP | 8-265175 | 10/1996 |
| JP | 9-511377 | 11/1997 |

OTHER PUBLICATIONS

NN67041607: (A Class of Error Correcting Codes with Simple Encoders and Decoders; IBM Technical Disclosure Bulletin, vol. No: 9, pp: 1607–1612; Apr. 1967, US).*
de Almeida et al. (Two–Dimensional Interleaving Using the Set Partitioning Technique; IEEE, Aug. 1994).*
NN67041607: (A Class of Error Correcting Codes with Simple Encoders and Decoders; IBM Technical Disclosure Bulletin, vol. No:9, pp: 1607–1612; Apr. 1967, US).*
de Almeida et al. (Two–Dimensional Interleaving Using the Set Partitioning Technique; IEEE, Aug. 1994).*
de Almeida, et al. (Two–dimensional interleaving using the set partitioning technique; IEEE, Jun. 27–Jul. 1, 1994).*
Beals, et al. (Las Vegas algorithms for matrix groups; IEEE, Nov. 3–5, 1993).*

(Continued)

Primary Examiner—Guy J. Lamarre
(74) Attorney, Agent, or Firm—Katten Muchin Rosenman LLP

(57) ABSTRACT

An interleaving apparatus comprises a first storing unit for storing data to be transmitted and a first control unit for controlling the first storing unit so that the data to be transmitted is outputted from the first storing unit with the data to be transmitted arranged in a matrix and at least either columns or rows of the data to be transmitted randomly rearranged, facilitating the interleaving. The result is that biased distribution of data, which leads to degradation of the transmission quality, can be prevented relatively easily in a simple structure.

59 Claims, 30 Drawing Sheets

OTHER PUBLICATIONS

Kagaris, et al. (On the use of counters for reproducing deterministic test sets; IEEE, Dec. 1996).*

Yamaguchi et al. ("Turbo Code", a new coding system approaching theoretical Shannon limits, is born in France; Nikki Electronics, Jul. 13, 1988).*

K Yamaguchi et al. "Turbo Code", A New Coding System Approaching Theoretical Shannon Limits, Is Born in France Article in "Nikkei Electronics" No. 721, Published Jul. 13, 1998; p. 168 col. 3 line 27 to p. 169 col. 3 line 5 is relevant to the present invention.

Telecommunications Industry Association, "Mobile Station–Base Station Compatibility Standard for Dual–Mode Wideband Spread Spectrum Cellular System", Jul. 1993: TIA/EIA/IS–95.

Berrou, et al., "Near Optimum Error Correcting Coding and Decoding: Turbo–Codes" XP000629465: IEEE Transactions on Communications, vol. 44, No. 10 pp. 1261–1271; Jan. 10, 1996.

Darmon, et al., "A New Pseudo–Random Interleaving for Antijamming Applications" XP010083412; pp. 6–10; 1989 IEEE.

Andrews, et al., "Interleaver Design Methods for Turbo Codes" XP010297207; p. 420; 1998 IEEE.

European Search Report dated Oct. 27, 2004.

* cited by examiner

F I G. 6

| | A | B | C | D | E | F | G | H | I | J | K | L | M | N | O | P |
|---|---|---|---|---|---|---|---|---|---|---|---|---|---|---|---|---|
| 1 | 000 | 001 | 002 | 003 | 004 | 005 | 006 | 007 | 008 | 009 | 010 | 011 | 012 | 013 | 014 | 015 |
| 2 | 016 | 017 | 018 | 019 | 020 | 021 | 022 | 023 | 024 | 025 | 026 | 027 | 028 | 029 | 030 | 031 |
| 3 | 032 | 033 | 034 | 035 | 036 | 037 | 038 | 039 | 040 | 041 | 042 | 043 | 044 | 045 | 046 | 047 |
| 4 | 048 | 049 | 050 | 051 | 052 | 053 | 054 | 055 | 056 | 057 | 058 | 059 | 060 | 061 | 062 | 063 |
| 5 | 064 | 065 | 066 | 067 | 068 | 069 | 070 | 071 | 072 | 073 | 074 | 075 | 076 | 077 | 078 | 079 |
| 6 | 080 | 081 | 082 | 083 | 084 | 085 | 086 | 087 | 088 | 089 | 090 | 091 | 092 | 093 | 094 | 095 |
| 7 | 096 | 097 | 098 | 099 | 100 | 101 | 102 | 103 | 104 | 105 | 106 | 107 | 108 | 109 | 110 | 111 |
| 8 | 112 | 113 | 114 | 115 | 116 | 117 | 118 | 119 | 120 | 121 | 122 | 123 | 124 | 125 | 126 | 127 |
| 9 | 128 | 129 | 130 | 131 | 132 | 133 | 134 | 135 | 136 | 137 | 138 | 139 | 140 | 141 | 142 | 143 |
| 10 | 144 | 145 | 146 | 147 | 148 | 149 | 150 | 151 | 152 | 153 | 154 | 155 | 156 | 157 | 158 | 159 |
| 11 | 160 | 161 | 162 | 163 | 164 | 165 | 166 | 167 | 168 | 169 | 170 | 171 | 172 | 173 | 174 | 175 |
| 12 | 176 | 177 | 178 | 179 | 180 | 181 | 182 | 183 | 184 | 185 | 186 | 187 | 188 | 189 | 190 | 191 |
| 13 | 192 | 193 | 194 | 195 | 196 | 197 | 198 | 199 | 200 | 201 | 202 | 203 | 204 | 205 | 206 | 207 |
| 14 | 208 | 209 | 210 | 211 | 212 | 213 | 214 | 215 | 216 | 217 | 218 | 219 | 220 | 221 | 222 | 223 |
| 15 | 224 | 225 | 226 | 227 | 228 | 229 | 230 | 231 | 232 | 233 | 234 | 235 | 236 | 237 | 238 | 239 |
| 16 | 240 | 241 | 242 | 243 | 244 | 245 | 246 | 247 | 248 | 249 | 250 | 251 | 252 | 253 | 254 | 255 |
| 17 | 256 | 257 | 258 | 259 | 260 | 261 | 262 | 263 | 264 | 265 | 266 | 267 | 268 | 269 | 270 | 271 |
| 18 | 272 | 273 | 274 | 275 | 276 | 277 | 278 | 279 | 280 | 281 | 282 | 283 | 284 | 285 | 286 | 287 |
| 19 | 288 | 289 | 290 | 291 | 292 | 293 | 294 | 295 | 296 | 297 | 298 | 299 | 300 | 301 | 302 | 303 |
| 20 | 304 | 305 | 306 | 307 | 308 | 309 | 310 | 311 | 312 | 313 | 314 | 315 | 316 | 317 | 318 | 319 |
| 21 | 320 | 321 | 322 | 323 | 324 | 325 | 326 | 327 | 328 | 329 | 330 | 331 | 332 | 333 | 334 | 335 |
| 22 | 336 | 337 | 338 | 339 | 340 | 341 | 342 | 343 | 344 | 345 | 346 | 347 | 348 | 349 | 350 | 351 |
| 23 | 352 | 353 | 354 | 355 | 356 | 357 | 358 | 359 | 360 | 361 | 362 | 363 | 364 | 365 | 366 | 367 |
| 24 | 368 | 369 | 370 | 371 | 372 | 373 | 374 | 375 | 376 | 377 | 378 | 379 | 380 | 381 | 382 | 383 |

FIG. 7

| | A | P | J | I | E | C | B | M | G | D | L | N | K | F | O | H |
|---|---|---|---|---|---|---|---|---|---|---|---|---|---|---|---|---|
| 1 | 000 | 015 | 009 | 008 | 004 | 002 | 001 | 012 | 006 | 003 | 011 | 013 | 010 | 005 | 014 | 007 |
| 2 | 016 | 031 | 025 | 024 | 020 | 018 | 017 | 028 | 022 | 019 | 027 | 029 | 026 | 021 | 030 | 023 |
| 3 | 032 | 047 | 041 | 040 | 036 | 034 | 033 | 044 | 038 | 035 | 043 | 045 | 042 | 037 | 046 | 039 |
| 4 | 048 | 063 | 057 | 056 | 052 | 050 | 049 | 060 | 054 | 051 | 059 | 061 | 058 | 053 | 062 | 055 |
| 5 | 064 | 079 | 073 | 072 | 068 | 066 | 065 | 076 | 070 | 067 | 075 | 077 | 074 | 069 | 078 | 071 |
| 6 | 080 | 095 | 089 | 088 | 084 | 082 | 081 | 092 | 086 | 083 | 091 | 093 | 090 | 085 | 094 | 087 |
| 7 | 096 | 111 | 105 | 104 | 100 | 098 | 097 | 108 | 102 | 099 | 107 | 109 | 106 | 101 | 110 | 103 |
| 8 | 112 | 127 | 121 | 120 | 116 | 114 | 113 | 124 | 118 | 115 | 123 | 125 | 122 | 117 | 126 | 119 |
| 9 | 128 | 143 | 137 | 136 | 132 | 130 | 129 | 140 | 134 | 131 | 139 | 141 | 138 | 133 | 142 | 135 |
| 10 | 144 | 159 | 153 | 152 | 148 | 146 | 145 | 156 | 150 | 147 | 155 | 157 | 154 | 149 | 158 | 151 |
| 11 | 160 | 175 | 169 | 168 | 164 | 162 | 161 | 172 | 166 | 163 | 171 | 173 | 170 | 165 | 174 | 167 |
| 12 | 176 | 191 | 185 | 184 | 180 | 178 | 177 | 188 | 182 | 179 | 187 | 189 | 186 | 181 | 190 | 183 |
| 13 | 192 | 207 | 201 | 200 | 196 | 194 | 193 | 204 | 198 | 195 | 203 | 205 | 202 | 197 | 206 | 199 |
| 14 | 208 | 223 | 217 | 216 | 212 | 210 | 209 | 220 | 214 | 211 | 219 | 221 | 218 | 213 | 222 | 215 |
| 15 | 224 | 239 | 233 | 232 | 228 | 226 | 225 | 236 | 230 | 227 | 235 | 237 | 234 | 229 | 238 | 231 |
| 16 | 240 | 255 | 249 | 248 | 244 | 242 | 241 | 252 | 246 | 243 | 251 | 253 | 250 | 245 | 254 | 247 |
| 17 | 256 | 271 | 265 | 264 | 260 | 258 | 257 | 268 | 262 | 259 | 267 | 269 | 266 | 261 | 270 | 263 |
| 18 | 272 | 287 | 281 | 280 | 276 | 274 | 273 | 284 | 278 | 275 | 283 | 285 | 282 | 277 | 286 | 279 |
| 19 | 288 | 303 | 297 | 296 | 292 | 290 | 289 | 300 | 294 | 291 | 299 | 301 | 298 | 293 | 302 | 295 |
| 20 | 304 | 319 | 313 | 312 | 308 | 306 | 305 | 316 | 310 | 307 | 315 | 317 | 314 | 309 | 318 | 311 |
| 21 | 320 | 335 | 329 | 328 | 324 | 322 | 321 | 332 | 326 | 323 | 331 | 333 | 330 | 325 | 334 | 327 |
| 22 | 336 | 351 | 345 | 344 | 340 | 338 | 337 | 348 | 342 | 339 | 347 | 349 | 346 | 341 | 350 | 343 |
| 23 | 352 | 367 | 361 | 360 | 356 | 354 | 353 | 364 | 358 | 355 | 363 | 365 | 362 | 357 | 366 | 359 |
| 24 | 368 | 383 | 377 | 376 | 372 | 370 | 369 | 380 | 374 | 371 | 379 | 381 | 378 | 373 | 382 | 375 |

FIG. 8

|    | A   | P   | J   | I   | E   | C   | B   | M   | G   | D   | L   | N   | K   | F   | O   | H   |
|----|-----|-----|-----|-----|-----|-----|-----|-----|-----|-----|-----|-----|-----|-----|-----|-----|
| 1  | 000 | 015 | 009 | 008 | 004 | 002 | 001 | 012 | 006 | 003 | 011 | 013 | 010 | 005 | 014 | 007 |
| 16 | 240 | 255 | 249 | 248 | 244 | 242 | 241 | 252 | 246 | 243 | 251 | 253 | 250 | 245 | 254 | 247 |
| 19 | 288 | 303 | 297 | 296 | 292 | 290 | 289 | 300 | 294 | 291 | 299 | 301 | 298 | 293 | 302 | 295 |
| 10 | 144 | 159 | 153 | 152 | 148 | 146 | 145 | 156 | 150 | 147 | 155 | 157 | 154 | 149 | 158 | 151 |
| 17 | 256 | 271 | 265 | 264 | 260 | 258 | 257 | 268 | 262 | 259 | 267 | 269 | 266 | 261 | 270 | 263 |
| 9  | 128 | 143 | 137 | 136 | 132 | 130 | 129 | 140 | 134 | 131 | 139 | 141 | 138 | 133 | 142 | 135 |
| 5  | 064 | 079 | 073 | 072 | 068 | 066 | 065 | 076 | 070 | 067 | 075 | 077 | 074 | 069 | 078 | 071 |
| 3  | 032 | 047 | 041 | 040 | 036 | 034 | 033 | 044 | 038 | 035 | 043 | 045 | 042 | 037 | 046 | 039 |
| 2  | 016 | 031 | 025 | 024 | 020 | 018 | 017 | 028 | 022 | 019 | 027 | 029 | 026 | 021 | 030 | 023 |
| 18 | 272 | 287 | 281 | 280 | 276 | 274 | 273 | 284 | 278 | 275 | 283 | 285 | 282 | 277 | 286 | 279 |
| 22 | 336 | 351 | 345 | 344 | 340 | 338 | 337 | 348 | 342 | 339 | 347 | 349 | 346 | 341 | 350 | 343 |
| 13 | 192 | 207 | 201 | 200 | 196 | 194 | 193 | 204 | 198 | 195 | 203 | 205 | 202 | 197 | 206 | 199 |
| 7  | 096 | 111 | 105 | 104 | 100 | 098 | 097 | 108 | 102 | 099 | 107 | 109 | 106 | 101 | 110 | 103 |
| 4  | 048 | 063 | 057 | 056 | 052 | 050 | 049 | 060 | 054 | 051 | 059 | 061 | 058 | 053 | 062 | 055 |
| 23 | 352 | 367 | 361 | 360 | 356 | 354 | 353 | 364 | 358 | 355 | 363 | 365 | 362 | 357 | 366 | 359 |
| 12 | 176 | 191 | 185 | 184 | 180 | 178 | 177 | 188 | 182 | 179 | 187 | 189 | 186 | 181 | 190 | 183 |
| 14 | 208 | 223 | 217 | 216 | 212 | 210 | 209 | 220 | 214 | 211 | 219 | 221 | 218 | 213 | 222 | 215 |
| 21 | 320 | 335 | 329 | 328 | 324 | 322 | 321 | 332 | 326 | 323 | 331 | 333 | 330 | 325 | 334 | 327 |
| 11 | 160 | 175 | 169 | 168 | 164 | 162 | 161 | 172 | 166 | 163 | 171 | 173 | 170 | 165 | 174 | 167 |
| 6  | 080 | 095 | 089 | 088 | 084 | 082 | 081 | 092 | 086 | 083 | 091 | 093 | 090 | 085 | 094 | 087 |
| 15 | 224 | 239 | 233 | 232 | 228 | 226 | 225 | 236 | 230 | 227 | 235 | 237 | 234 | 229 | 238 | 231 |
| 8  | 112 | 127 | 121 | 120 | 116 | 114 | 113 | 124 | 118 | 115 | 123 | 125 | 122 | 117 | 126 | 119 |
| 20 | 304 | 319 | 313 | 312 | 308 | 306 | 305 | 316 | 310 | 307 | 315 | 317 | 314 | 309 | 318 | 311 |
| 24 | 368 | 383 | 377 | 376 | 372 | 370 | 369 | 380 | 374 | 371 | 379 | 381 | 378 | 373 | 382 | 375 |

| Output of A column generating circuit | 000 | 144 | 120 | 216 | 096 | 312 | 192 | 360 | 072 | 048 | 288 | 240 |
|---|---|---|---|---|---|---|---|---|---|---|---|---|
| Output of one row generating circuit | 000 | 000 | 000 | 000 | 000 | 000 | 000 | 000 | 000 | 000 | 000 | 000 |
| Output of adder | 000 | 144 | 120 | 216 | 096 | 312 | 192 | 360 | 072 | 048 | 288 | 240 |

$\alpha$

| 168 | 264 | 336 | 024 | \| | 000 | 144 | 120 | 216 | 096 | 312 | 192 | 360 | 072 | 048 | 288 |
| 000 | 000 | 000 | 000 | \| | 008 | 008 | 008 | 008 | 008 | 008 | 008 | 008 | 008 | 008 | 008 |
| 168 | 264 | 336 | 024 | \| | 000 | 152 | 128 | 224 | 104 | 320 | 200 | 368 | 080 | 056 | 296 |

$\alpha$

| 240 | 168 | 264 | 336 | 024 | \| | 000 | 144 | 120 | 216 | 096 | 312 | 192 | 360 | 072 | 048 |
| 008 | 008 | 008 | 008 | 008 | \| | 007 | 007 | 007 | 007 | 007 | 007 | 007 | 007 | 007 | 007 |
| 248 | 176 | 272 | 344 | 032 | \| | 007 | 151 | 127 | 223 | 103 | 319 | 199 | 367 | 079 | 055 |

$\alpha$                 $\alpha$

| 288 240 168 264 336 024 | 000 144...336 024 | 000 144...336 024 |
| 007 007 007 007 007 007 | 013 013...013 013 | 006 006...006 006 |
| 295 247 175 271 343 031 | 013 157...349 037 | 006 150...342 030 |

$\alpha$      $\alpha$      $\alpha$      $\alpha$

| \| 000 144...336 024 | \| 000 144...336 024 | \| 000 144...336 024 | \|
| \| 019 019...019 019 | \| 012 012...012 012 | \| 021 021...021 021 | \|
| \| 019 163...355 043 | \| 012 156...348 036 | \| 021 165...357 045 | \|

$\alpha$    $\alpha$    $\alpha$    $\alpha$    $\alpha$    $\alpha$    $\alpha$

| 000... | 000... | 000... | 000... | 000... | 000... | 000... | 000... |
| 005... | 003... | 018... | 015... | 011... | 016... | 020... | 001... |
| 005... | 003... | 018... | 015... | 011... | 016... | 020... | 001... |

$\alpha$    $\alpha$    $\alpha$    $\alpha$    $\alpha$    $\alpha$    $\alpha$

| \| 000... | 000... | 000... | 000... | 000... | 000... | 000 144...024 |
| \| 004... | 009... | 002... | 022... | 017... | 010... | 014 014...014 |
| \| 004... | 009... | 002... | 022... | 017... | 010... | 014 158...038 |

$\alpha$

| \| 000 144 120 216 096 312 192 360 072...336 024 |
| \| 023 023 023 023 023 023 023 023 023...023 023 |
| \| 023 167 143 239 119 335 215 383 095...359 047 |

FIG. 22
(PRIOR ART)

| A' | B' | C' | D' | E' | F' | G' | H' | I' | J' | K' | L' | M' | N' | O' | P' |
|---|---|---|---|---|---|---|---|---|---|---|---|---|---|---|---|
| 000 | 001 | 002 | 003 | 004 | 005 | 006 | 007 | 008 | 009 | 010 | 011 | 012 | 013 | 014 | 015 |
| 016 | 017 | 018 | 019 | 020 | 021 | 022 | 023 | 024 | 025 | 026 | 027 | 028 | 029 | 030 | 031 |
| 032 | 033 | 034 | 035 | 036 | 037 | 038 | 039 | 040 | 041 | 042 | 043 | 044 | 045 | 046 | 047 |
| 048 | 049 | 050 | 051 | 052 | 053 | 054 | 055 | 056 | 057 | 058 | 059 | 060 | 061 | 062 | 063 |
| 064 | 065 | 066 | 067 | 068 | 069 | 070 | 071 | 072 | 073 | 074 | 075 | 076 | 077 | 078 | 079 |
| 080 | 081 | 082 | 083 | 084 | 085 | 086 | 087 | 088 | 089 | 090 | 091 | 092 | 093 | 094 | 095 |
| 096 | 097 | 098 | 099 | 100 | 101 | 102 | 103 | 104 | 105 | 106 | 107 | 108 | 109 | 110 | 111 |
| 112 | 113 | 114 | 115 | 116 | 117 | 118 | 119 | 120 | 121 | 122 | 123 | 124 | 125 | 126 | 127 |
| 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 |
| 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 |
| 192 | 193 | 194 | 195 | 196 | 197 | 198 | 199 | 200 | 201 | 202 | 203 | 204 | 205 | 206 | 207 |
| 208 | 209 | 210 | 211 | 212 | 213 | 214 | 215 | 216 | 217 | 218 | 219 | 220 | 221 | 222 | 223 |
| 224 | 225 | 226 | 227 | 228 | 229 | 230 | 231 | 232 | 233 | 234 | 235 | 236 | 237 | 238 | 239 |
| 240 | 241 | 242 | 243 | 244 | 245 | 246 | 247 | 248 | 249 | 250 | 251 | 252 | 253 | 254 | 255 |
| 256 | 257 | 258 | 259 | 260 | 261 | 262 | 263 | 264 | 265 | 266 | 267 | 268 | 269 | 270 | 271 |
| 272 | 273 | 274 | 275 | 276 | 277 | 278 | 279 | 280 | 281 | 282 | 283 | 284 | 285 | 286 | 287 |
| 288 | 289 | 290 | 291 | 292 | 293 | 294 | 295 | 296 | 297 | 298 | 299 | 300 | 301 | 302 | 303 |
| 304 | 305 | 306 | 307 | 308 | 309 | 310 | 311 | 312 | 313 | 314 | 315 | 316 | 317 | 318 | 319 |
| 320 | 321 | 322 | 323 | 324 | 325 | 326 | 327 | 328 | 329 | 330 | 331 | 332 | 333 | 334 | 335 |
| 336 | 337 | 338 | 339 | 340 | 341 | 342 | 343 | 344 | 345 | 346 | 347 | 348 | 349 | 350 | 351 |
| 352 | 353 | 354 | 355 | 356 | 357 | 358 | 359 | 360 | 361 | 362 | 363 | 364 | 365 | 366 | 367 |
| 368 | 369 | 370 | 371 | 372 | 373 | 374 | 375 | 376 | 377 | 378 | 379 | 380 | 381 | 382 | 383 |

FIG. 23
(PRIOR ART)

| 1 | P | 2 | D | 3 | N | 4 | S |
|---|---|---|---|---|---|---|---|
| 5 | C | 6 | H | 7 | I | 8 | J |
| 9 | K | 10 | M | 11 | A | 12 | L |
| 13 | G | 14 | Q | 15 | E | 16 | B |
| 17 | T | 18 | R | 19 | O | 20 | F |

| 1 | 5 | 9 | 13 | 2 | 6 | 10 | 14 | 3 | 7 | 11 | 15 | 4 | 8 | 12 | 16 |
|---|---|---|----|---|---|----|----|---|---|----|----|---|---|----|----|
| 000 | 001 | 002 | 003 | 004 | 005 | 006 | 007 | 008 | 009 | 010 | 011 | 012 | 013 | 014 | 015 |
| 016 | 017 | 018 | 019 | 020 | 021 | 022 | 023 | 024 | 025 | 026 | 027 | 028 | 029 | 030 | 031 |
| 032 | 033 | 034 | 035 | 036 | 037 | 038 | 039 | 040 | 041 | 042 | 043 | 044 | 045 | 046 | 047 |
| 048 | 049 | 050 | 051 | 052 | 053 | 054 | 055 | 056 | 057 | 058 | 059 | 060 | 061 | 062 | 063 |
| 064 | 065 | 066 | 067 | 068 | 069 | 070 | 071 | 072 | 073 | 074 | 075 | 076 | 077 | 078 | 079 |
| 080 | 081 | 082 | 083 | 084 | 085 | 086 | 087 | 088 | 089 | 090 | 091 | 092 | 093 | 094 | 095 |
| 096 | 097 | 098 | 099 | 100 | 101 | 102 | 103 | 104 | 105 | 106 | 107 | 108 | 109 | 110 | 111 |
| 112 | 113 | 114 | 115 | 116 | 117 | 118 | 119 | 120 | 121 | 122 | 123 | 124 | 125 | 126 | 127 |
| 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 |
| 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 |
| 192 | 193 | 194 | 195 | 196 | 197 | 198 | 199 | 200 | 201 | 202 | 203 | 204 | 205 | 206 | 207 |
| 208 | 209 | 210 | 211 | 212 | 213 | 214 | 215 | 216 | 217 | 218 | 219 | 220 | 221 | 222 | 223 |
| 224 | 225 | 226 | 227 | 228 | 229 | 230 | 231 | 232 | 233 | 234 | 235 | 236 | 237 | 238 | 239 |
| 240 | 241 | 242 | 243 | 244 | 245 | 246 | 247 | 248 | 249 | 250 | 251 | 252 | 253 | 254 | 255 |
| 256 | 257 | 258 | 259 | 260 | 261 | 262 | 263 | 264 | 265 | 266 | 267 | 268 | 269 | 270 | 271 |
| 272 | 273 | 274 | 275 | 276 | 277 | 278 | 279 | 280 | 281 | 282 | 283 | 284 | 285 | 286 | 287 |
| 288 | 289 | 290 | 291 | 292 | 293 | 294 | 295 | 296 | 297 | 298 | 299 | 300 | 301 | 302 | 303 |
| 304 | 305 | 306 | 307 | 308 | 309 | 310 | 311 | 312 | 313 | 314 | 315 | 316 | 317 | 318 | 319 |
| 320 | 321 | 322 | 323 | 324 | 325 | 326 | 327 | 328 | 329 | 330 | 331 | 332 | 333 | 334 | 335 |
| 336 | 337 | 338 | 339 | 340 | 341 | 342 | 343 | 344 | 345 | 346 | 347 | 348 | 349 | 350 | 351 |
| 352 | 353 | 354 | 355 | 356 | 357 | 358 | 359 | 360 | 361 | 362 | 363 | 364 | 365 | 366 | 367 |
| 368 | 369 | 370 | 371 | 372 | 373 | 374 | 375 | 376 | 377 | 378 | 379 | 380 | 381 | 382 | 383 |

FIG. 26

| 1 | 3 | 2 | 4 |
|---|---|---|---|
| 000 004 008 012 | 001 005 009 013 | 002 006 010 014 | 003 007 011 015 |
| 016 020 024 028 | 017 021 025 029 | 018 022 026 030 | 019 023 027 031 |
| 032 036 040 044 | 033 037 041 045 | 034 038 042 046 | 035 039 043 047 |
| 048 052 056 060 | 049 053 057 061 | 050 054 058 062 | 051 055 059 063 |
| 064 068 072 076 | 065 069 073 077 | 066 070 074 078 | 067 071 075 079 |
| 080 084 088 092 | 081 085 089 093 | 082 086 090 094 | 083 087 091 095 |
| 096 100 104 108 | 097 101 105 109 | 098 102 106 110 | 099 103 107 111 |
| 112 116 120 124 | 113 117 121 125 | 114 118 122 126 | 115 119 123 127 |
| 128 132 136 140 | 129 133 137 141 | 130 134 138 142 | 131 135 139 143 |
| 144 148 152 156 | 145 149 153 157 | 146 150 154 158 | 147 151 155 159 |
| 160 164 168 172 | 161 165 169 173 | 162 166 170 174 | 163 167 171 175 |
| 176 180 184 188 | 177 181 185 189 | 178 182 186 190 | 179 183 187 191 |
| 192 196 200 204 | 193 197 201 205 | 194 198 202 206 | 195 199 203 207 |
| 208 212 216 220 | 209 213 217 221 | 210 214 218 222 | 211 215 219 223 |
| 224 228 232 236 | 225 229 233 237 | 226 230 234 238 | 227 231 235 239 |
| 240 244 248 252 | 241 245 249 253 | 242 246 250 254 | 243 247 251 255 |
| 256 260 264 268 | 257 261 265 269 | 258 262 266 270 | 259 263 267 271 |
| 272 276 280 284 | 273 277 281 285 | 274 278 282 286 | 275 279 283 287 |
| 288 292 296 300 | 289 293 297 301 | 290 294 298 302 | 291 295 299 303 |
| 304 308 312 316 | 305 309 313 317 | 306 310 314 318 | 307 311 315 319 |
| 320 324 328 332 | 321 325 329 333 | 322 326 330 334 | 323 327 331 335 |
| 336 340 344 348 | 337 341 345 349 | 338 342 346 350 | 339 343 347 351 |
| 352 356 360 364 | 353 357 361 365 | 354 358 362 366 | 355 359 363 367 |
| 368 372 376 380 | 369 373 377 381 | 370 374 378 382 | 371 375 379 383 |

F I G. 27

| 1 | 3 | 2 | 4 | 1 | 3 | 2 | 4 | 1 | 3 | 2 | 4 | 1 | 3 | 2 | 4 |
|---|---|---|---|---|---|---|---|---|---|---|---|---|---|---|---|
| 000 | 004 | 008 | 012 | 002 | 006 | 010 | 014 | 001 | 005 | 009 | 013 | 003 | 007 | 011 | 015 |
| 016 | 020 | 024 | 028 | 018 | 022 | 026 | 030 | 017 | 021 | 025 | 029 | 019 | 023 | 027 | 031 |
| 032 | 036 | 040 | 044 | 034 | 038 | 042 | 046 | 033 | 037 | 041 | 045 | 035 | 039 | 043 | 047 |
| 048 | 052 | 056 | 060 | 050 | 054 | 058 | 062 | 049 | 053 | 057 | 061 | 051 | 055 | 059 | 063 |
| 064 | 068 | 072 | 076 | 066 | 070 | 074 | 078 | 065 | 069 | 073 | 077 | 067 | 071 | 075 | 079 |
| 080 | 084 | 088 | 092 | 082 | 086 | 090 | 094 | 081 | 085 | 089 | 093 | 083 | 087 | 091 | 095 |
| 096 | 100 | 104 | 108 | 098 | 102 | 106 | 110 | 097 | 101 | 105 | 109 | 099 | 103 | 107 | 111 |
| 112 | 116 | 120 | 124 | 114 | 118 | 122 | 126 | 113 | 117 | 121 | 125 | 115 | 119 | 123 | 127 |
| 128 | 132 | 136 | 140 | 130 | 134 | 138 | 142 | 129 | 133 | 137 | 141 | 131 | 135 | 139 | 143 |
| 144 | 148 | 152 | 156 | 146 | 150 | 154 | 158 | 145 | 149 | 153 | 157 | 147 | 151 | 155 | 159 |
| 160 | 164 | 168 | 172 | 162 | 166 | 170 | 174 | 161 | 165 | 169 | 173 | 163 | 167 | 171 | 175 |
| 176 | 180 | 184 | 188 | 178 | 182 | 186 | 190 | 177 | 181 | 185 | 189 | 179 | 183 | 187 | 191 |
| 192 | 196 | 200 | 204 | 194 | 198 | 202 | 206 | 193 | 197 | 201 | 205 | 195 | 199 | 203 | 207 |
| 208 | 212 | 216 | 220 | 210 | 214 | 218 | 222 | 209 | 213 | 217 | 221 | 211 | 215 | 219 | 223 |
| 224 | 228 | 232 | 236 | 226 | 230 | 234 | 238 | 225 | 229 | 233 | 237 | 227 | 231 | 235 | 239 |
| 240 | 244 | 248 | 252 | 242 | 246 | 250 | 254 | 241 | 245 | 249 | 253 | 243 | 247 | 251 | 255 |
| 256 | 260 | 264 | 268 | 258 | 262 | 266 | 270 | 257 | 261 | 265 | 269 | 259 | 263 | 267 | 271 |
| 272 | 276 | 280 | 284 | 274 | 278 | 282 | 286 | 273 | 277 | 281 | 285 | 275 | 279 | 283 | 287 |
| 288 | 292 | 296 | 300 | 290 | 294 | 298 | 302 | 289 | 293 | 297 | 301 | 291 | 295 | 299 | 303 |
| 304 | 308 | 312 | 316 | 306 | 310 | 314 | 318 | 305 | 309 | 313 | 317 | 307 | 311 | 315 | 319 |
| 320 | 324 | 328 | 332 | 322 | 326 | 330 | 334 | 321 | 325 | 329 | 333 | 323 | 327 | 331 | 335 |
| 336 | 340 | 344 | 348 | 338 | 342 | 346 | 350 | 337 | 341 | 345 | 349 | 339 | 343 | 347 | 351 |
| 352 | 356 | 360 | 364 | 354 | 358 | 362 | 366 | 353 | 357 | 361 | 365 | 355 | 359 | 363 | 367 |
| 368 | 372 | 376 | 380 | 370 | 374 | 378 | 382 | 369 | 373 | 377 | 381 | 371 | 375 | 379 | 383 |

F I G. 28

| 1 | 000 008 004 012 002 010 006 014 001 009 005 013 003 011 007 015 |
| 5 | 016 024 020 028 018 026 022 033 017 025 021 029 019 027 023 031 |
| 9 | 032 040 036 044 034 042 038 046 033 041 037 045 035 043 039 047 |
| 13 | 048 056 052 060 050 058 054 062 049 057 053 061 051 059 055 063 |
| 17 | 064 072 068 076 066 074 070 078 065 073 069 077 067 075 071 079 |
| 21 | 080 088 084 092 082 090 086 094 081 089 085 093 083 091 087 095 |
| 2 | 096 104 100 108 098 106 102 110 097 105 101 109 099 107 103 111 |
| 6 | 112 120 116 124 114 122 118 126 113 121 117 125 115 123 119 127 |
| 10 | 128 136 132 140 130 138 134 142 129 137 133 141 131 139 135 143 |
| 14 | 144 152 148 156 146 154 150 158 145 153 149 157 147 155 151 159 |
| 18 | 160 168 164 172 162 170 166 174 161 169 165 173 163 171 167 175 |
| 22 | 176 184 180 188 178 186 182 190 177 185 181 189 179 187 183 191 |
| 3 | 192 200 196 204 194 202 198 206 193 201 197 205 195 203 199 207 |
| 7 | 208 216 212 220 210 218 214 222 209 217 213 221 211 219 215 223 |
| 11 | 224 232 228 236 226 234 230 238 225 233 229 237 227 235 231 239 |
| 15 | 240 248 244 252 242 250 246 254 241 249 245 253 243 251 247 255 |
| 19 | 256 264 260 268 258 266 262 270 257 265 261 269 259 267 263 271 |
| 23 | 272 280 276 284 274 282 278 286 273 281 277 285 275 283 279 287 |
| 4 | 288 296 292 300 290 298 294 302 289 297 293 301 291 299 295 303 |
| 8 | 304 312 308 316 306 314 310 318 305 313 309 317 307 315 311 319 |
| 12 | 320 328 324 332 322 330 326 334 321 329 325 333 323 331 327 335 |
| 16 | 336 344 340 348 338 346 342 350 337 345 341 349 339 347 343 351 |
| 20 | 352 360 356 364 354 362 358 366 353 361 357 365 355 363 359 367 |
| 24 | 368 376 372 380 370 378 374 382 369 377 373 381 371 379 375 383 |

FIG. 29

| | |
|---|---|
| 1 | 000 008 004 012 002 010 006 014 001 009 005 013 003 011 007 015<br>096 104 100 108 098 106 102 110 097 105 101 109 099 107 103 111<br>192 200 196 204 194 202 198 206 193 201 197 205 195 203 199 207<br>288 296 292 300 290 298 294 302 289 297 293 301 291 299 295 303 |
| 4 | 016 024 020 028 018 026 022 030 017 025 021 029 019 027 023 031<br>112 120 116 124 114 122 118 126 113 121 117 125 115 123 119 127<br>208 216 212 220 210 218 214 222 209 217 213 221 211 219 215 223<br>304 312 308 316 306 314 310 318 305 313 309 317 307 315 311 319 |
| 2 | 032 040 036 044 034 042 038 046 033 041 037 045 035 043 039 047<br>128 136 132 140 130 138 134 142 129 137 133 141 131 139 135 143<br>224 232 228 236 226 234 230 238 225 233 229 237 227 235 231 239<br>320 328 324 332 322 330 326 334 321 329 325 333 323 331 327 335 |
| 5 | 048 056 052 060 050 058 054 062 049 057 053 061 051 059 055 063<br>144 152 148 156 146 154 150 158 145 153 149 157 147 155 151 159<br>240 248 244 252 242 250 246 254 241 249 245 253 243 251 247 255<br>336 344 340 348 338 346 342 350 337 345 341 349 339 347 343 351 |
| 3 | 064 072 068 076 066 074 070 078 065 073 069 077 067 075 071 079<br>160 168 164 172 162 170 166 174 161 169 165 173 163 171 167 175<br>256 264 260 268 258 266 262 270 257 265 261 269 259 267 263 271<br>352 360 356 364 354 362 358 366 353 361 357 365 355 363 359 367 |
| 6 | 080 088 084 092 082 090 086 094 081 089 085 093 083 091 087 095<br>176 184 180 188 178 186 182 190 177 185 181 189 179 187 183 191<br>272 280 276 284 274 282 278 286 273 281 277 285 275 283 279 287<br>368 376 372 380 370 378 374 382 369 377 373 381 371 379 375 383 |

FIG. 30

| | |
|---|---|
| 1 | 000 008 004 012 002 010 006 014 001 009 005 013 003 011 007 015 |
| 3 | 096 104 100 108 098 106 102 110 097 105 101 109 099 107 103 111 |
| 2 | 192 200 196 204 194 202 198 206 193 201 197 205 195 203 199 207 |
| 4 | 288 296 292 300 290 298 294 302 289 297 293 301 291 299 295 303 |
| 1 | 032 040 036 044 034 042 038 046 033 041 037 045 035 043 039 047 |
| 3 | 128 136 132 140 130 138 134 142 129 137 133 141 131 139 135 143 |
| 2 | 224 232 228 236 226 234 230 238 225 233 229 237 227 235 231 239 |
| 4 | 320 328 324 332 322 330 326 334 321 329 325 333 323 331 327 335 |
| 1 | 064 072 068 076 066 074 070 078 065 073 069 077 067 075 071 079 |
| 3 | 160 168 164 172 162 170 166 174 161 169 165 173 163 171 167 175 |
| 2 | 256 264 260 268 258 266 262 270 257 265 261 269 259 267 263 271 |
| 4 | 352 360 356 364 354 362 358 366 353 361 357 365 355 363 359 367 |
| 1 | 016 024 020 028 018 026 022 030 017 025 021 029 019 027 023 031 |
| 3 | 112 120 116 124 114 122 118 126 113 121 117 125 115 123 119 127 |
| 2 | 208 216 212 220 210 218 214 222 209 217 213 221 211 219 215 223 |
| 4 | 304 312 308 316 306 314 310 318 305 313 309 317 307 315 311 319 |
| 1 | 048 056 052 060 050 058 054 062 049 057 053 061 051 059 055 063 |
| 3 | 144 152 148 156 146 154 150 158 145 153 149 157 147 155 151 159 |
| 2 | 240 248 244 252 242 250 246 254 241 249 245 253 243 251 247 255 |
| 4 | 336 344 340 348 338 346 342 350 337 345 341 349 339 347 343 351 |
| 1 | 080 088 084 092 082 090 086 094 081 089 085 093 083 091 087 095 |
| 3 | 176 184 180 188 178 186 182 190 177 185 181 189 179 187 183 191 |
| 2 | 272 280 276 284 274 282 278 286 273 281 277 285 275 283 279 287 |
| 4 | 368 376 372 380 370 378 374 382 369 377 373 381 371 379 375 383 |

FIG. 31

| | A' |
|---|---|
| 1' | 000 008 004 012 002 010 006 014 001 009 005 013 003 011 007 015<br>192 200 196 204 194 202 198 206 193 201 197 205 195 203 199 207<br>096 104 100 108 098 106 102 110 097 105 101 109 099 107 103 111<br>288 296 292 300 290 298 294 302 289 297 293 301 291 299 295 303<br><br>032 040 036 044 034 042 038 046 033 041 037 045 035 043 039 047<br>224 232 228 236 226 234 230 238 225 233 229 237 227 235 231 239<br>128 136 132 140 130 138 134 142 129 137 133 141 131 139 135 143<br>320 328 324 332 322 330 326 334 321 329 325 333 323 331 327 335<br><br>064 072 068 076 066 074 070 078 065 073 069 077 067 075 071 079<br>256 264 260 268 258 266 262 270 257 265 261 269 259 267 263 271<br>160 168 164 172 162 170 166 174 161 169 165 173 163 171 167 175<br>352 360 356 364 354 362 358 366 353 361 357 365 355 363 359 367<br><br>016 024 020 028 018 026 022 030 017 025 021 029 019 027 023 031<br>208 216 212 220 210 218 214 222 209 217 213 221 211 219 215 223<br>112 120 116 124 114 122 118 126 113 121 117 125 115 123 119 127<br>304 312 308 316 306 314 310 318 305 313 309 317 307 315 311 319<br><br>048 056 052 060 050 058 054 062 049 057 053 061 051 059 055 063<br>240 248 244 252 242 250 246 254 241 249 245 253 243 251 247 255<br>144 152 148 156 146 154 150 158 145 153 149 157 147 155 151 159<br>336 344 340 348 338 346 342 350 337 345 341 349 339 347 343 351<br><br>080 088 084 092 082 090 086 094 081 089 085 093 083 091 087 095<br>272 280 276 284 274 282 278 286 273 281 277 285 275 283 279 287<br>176 184 180 188 178 186 182 190 177 185 181 189 179 187 183 191<br>368 376 372 380 370 378 374 382 369 377 373 381 371 379 375 383 |

FIG. 32

| | | | | | | | | | | | | | | | | | | | | | | | |
|---|---|---|---|---|---|---|---|---|---|---|---|---|---|---|---|---|---|---|---|---|---|---|---|
|000|192|096|288|032|224|128|320|064|256|160|352|016|208|112|304|048|240|144|336|080|272|176|368|
|008|200|104|296|040|232|136|328|072|264|168|360|024|216|120|312|056|248|152|344|088|280|184|376|
|004|196|100|292|036|228|132|324|068|260|164|356|020|212|116|308|052|244|148|340|084|276|180|372|
|012|204|108|300|044|236|140|332|076|268|172|364|028|220|124|316|060|252|156|348|092|284|188|380|
|002|194|098|290|034|226|130|322|066|258|162|354|018|210|114|306|050|242|146|338|082|274|178|370|
|010|202|106|298|042|234|138|330|074|266|170|362|026|218|122|314|058|250|154|346|090|282|186|378|
|006|198|102|294|038|230|134|326|070|262|166|358|022|214|118|310|054|246|150|342|086|278|182|374|
|014|206|110|302|046|238|142|334|078|270|174|366|030|222|126|318|062|254|158|350|094|286|190|382|
|001|193|097|289|033|225|129|321|065|257|161|353|017|209|113|305|049|241|145|337|081|273|177|369|
|009|201|105|297|041|233|137|329|073|265|169|361|025|217|121|313|057|249|153|345|089|281|185|377|
|005|197|101|293|037|229|133|325|069|261|165|357|021|213|117|309|053|245|149|341|085|277|181|373|
|013|205|109|301|045|237|141|333|077|269|173|365|029|221|125|317|061|253|157|349|093|285|189|381|
|003|195|099|291|035|227|131|323|067|259|163|355|019|211|115|307|051|243|147|339|083|275|179|371|
|011|203|107|299|043|235|139|331|075|267|171|363|027|219|123|315|059|251|155|347|091|283|187|379|
|007|199|103|295|039|231|135|327|071|263|167|359|023|215|119|311|055|247|151|343|087|279|183|375|
|015|207|111|303|047|239|143|335|079|271|175|367|031|223|127|319|063|255|159|351|095|287|191|383|

INTERLEAVING METHOD AND APPARATUS, DE-INTERLEAVING METHOD AND APPARATUS, AND INTERLEAVING/DE-INTERLEAVING SYSTEM AND APPARATUS

BACKGROUND OF THE INVENTION (1) Field of the Invention

The present invention relates to an interleaving method and a de-interleaving method, an interleaving apparatus and a de-interleaving apparatus, an interleaving/de-interleaving system, and an interleaving/de-interleaving apparatus, which can suitably rearrange a data array.

(2) Description of Related Art

In radio communications, there is a case where data transmitted from a transmitter to a receiver is affected by fading during transmission so that the data is changed to erroneous data differing from received contents.

As a technique dealing with fading, there are interleaving and de-interleaving. Interleaving is a technique of rearranging an order of data to be transmitted, and outputting the data when the data is transmitted from a transmitter, for example. On the other hand, de-interleaving is a technique of rearranging an order of the interleaved data transmitted from the transmitter back to an order before interleaved.

Interleaving is classified into block-interleaving and random-interleaving.

Block interleaving is to regularly rearrange an array of data.

For example, data before block-interleaved are "D0, D1, D2, D3, . . . and D383". Incidentally, the data will be described as "0, 1, 2, 3, . . . and 383", hereinafter.

These 384 (0–383) of data are assumed to be, as shown in FIG. 22, arranged in a matrix of 24 rows by 16 columns in a storing unit. When written, the data is rearranged in order in the direction of rows, and read out from each column (A'-P') in order.

The data read out is rearranged into "000", "016", "032", "048", "064", "080", "096", "112", "128", "144", "160", "176", . . . "351", "367", and "383". In a sequence of interleaved data, data numbers having been spaced at mostly 15 of data are arranged such as "000", "016", "031" and so on.

When reading of the last data "368" in the column A' is completed in reading the data, the leading data "001" in column B' is next read out. At the ending/beginning of other column, the data is read out in the similar manner. When the last data "383" is read out, the leading data in column A' is next read out.

On the other hand, when the receiver receives block-interleaved data, the receiver rearranges the data in the order of the data before interleaved by performing the reverse processing.

The block-interleaved data is affected by fading during transmission while transmitted from the transmitter to the receiver, changed into contents different from the transmitted contents, and received with burst errors by the receiver. Assuming that burst errors generate in the data in column B' (001, 017, 033, 049, 065, 081, 097, 113, 129, 145, 161, 177, 193, 209, 225, 241, 257, 273, 289, 305, 321, 337, 353 and 369) shown in FIG. 22, for example.

The receiver de-interleaves the received data to rearrange the data in the order before interleaved in the transmitter (000, 001, 002, 003, 004, . . . 381, 382 and 383).

The erroneous data continuously generated in the transmitted data is thereby regularly distributed. Namely, the erroneous data is spaced at every 15 data numbers so as to be distributed and arranged in the data (000–383).

The erroneous data is corrected by an error correcting function in consideration of a relation with the preceding/following data.

Accordingly, block interleaving/block de-interleaving facilitate correction of continuous errors by regularly distributing the errors, as above.

When burst errors generate in the leading data "001" in column B' to the data "130" in column C', for example, the erroneous data distributed in the de-interleaved data "0–383" might be continuously placed as "001" and "002". In such case, it possibly occurs that the errors cannot be corrected by the error correcting function.

On the other hand, random interleaving is to randomly rearrange an array of data.

FIG. 23 is a diagram illustrating random interleaving. As shown in FIG. 23, random interleaving is to rearrange the data by writing the data in the order of described numbers in a storing unit and reading the data in alphabetical order.

In the case where the data is randomly written in the storing unit in random interleaving, the data "0–383" is randomly written in a matrix of 24 rows by 16 columns in the storing unit, as shown in FIG. 24, for example.

If the data is read out in the order arranged in the row when read out from the storing unit, the data read out is rearranged in the order of "000", "255", "127", "063", "031", "015", "263", "240", "376", "251", "125", . . . , "123", "061", "030" and "271".

The random-interleaved data are rearranged, not following the rule that the block-interleaved data is spaced at every 15 data numbers, when compared with the block-interleaved data.

When reading of the last data "232" in the first row is completed in reading the data, the leading data "116" in the second row is then read out. The reading of the ending/beginning of the data in other row is performed in the similar manner. When the last data "271" is read out, the leading first row is next read out.

On the other hand, when the receiver receives the random-interleaved data, the data random-interleaved is rearranged in the order of the data before random-interleaved in the reverse processing.

The random-interleaved data is affected by fading during transmission when transmitted from the transmitter to the receiver so as to be changed to contents different from the transmitted contents, and received with burst errors by the receiver. Assuming that burst errors generate in the data in the second row (116, 314, 206, 103, 307, 153, 076, 038, 019, 009, 026, 130, 065, 288, 144 and 328) shown in FIG. 24, for example.

The receiver de-interleaves the received data to rearrange the data in the order before interleaved in the transmitter (000, 001, 002, 003, 004, . . . , 381, 382 and 383).

The erroneous data (116, 314, 206, 103, 307, 153, 076, 038, 019, 009, 260, 130, 065, 288, 144 and 328) having continuously generated in the transmitted data is irregularly distributed in the data (000–383).

The erroneous data is corrected by the error correcting function in consideration with a relation with the preceding/following data.

Next, assume that burst errors are generated in the data (198, 099, 305, 152, 332, 166, 083, 041, 276, 197, 354, 177, 088, 300, 150 and 331) in the $14^{th}$ row shown in FIG. 24.

The erroneous data is distributed in the data (000–383), but each erroneous data is placed in the neighboring positions to each other when rearranged into the state before random-interleaved.

Namely, "083" and "088", "150" and "152", "197" and "198", "300" and "305", and "331" and "332" in the erroneous data are distributed in totaling 384 (000–383) of data, but the erroneous data is placed in the neighboring positions to each other, which cannot be possibly corrected by the error correcting function.

In such case, errors having generated in bursts are randomly distributed in random interleaving/random de-interleaving. However, positions of the distributed errors are locally close to each other, which leads to deviation of the distribution.

Next, assuming that 65536 (256×256) of data are arranged in a matrix of 256 rows by 256 columns in the storing unit.

When $$i' = 129(i+j) \bmod 256 \quad (1)$$

$$j'[P(\xi) \cdot (i+1)] - 1 \bmod 256 \quad (2),$$

the data is written in the order of the i-th row and the j-th column, and read out in the order of the i1-th row and the j1-th column.

In the above formulae (1) and (2), $\xi = (i+j)$ mode 8, $P(0)=17$, $P(1)=37$, $P(2)=19$, $P(3)=29$, $P(4)=41$, $P(5)=23$, $P(6)=13$ and $P(7)=7$ (i, j, i', j'=0, 1–8).

The data is written in the storing unit in the order of the i-th row and the j-th column (the 1st column and the 1st row, the 1st row and the 2nd column, . . . , the 1st row and the 256th column, the 2nd row and the 1st column, . . . and the 256th row and the 256th column), and read out in the order of the i'-th row and the j'-th column from the storing unit.

(X mod y) represents a remainder generated when x is divided by y.

However, fabrication of an interleaving apparatus which reads according to the above formulae (1) and (2) is not easy since a manner of random generation is complicated.

Fabrication of a de-interleaving apparatus which de-interleaves the data interleaved in the above manner is also not easy.

SUMMARY OF THE INVENTION

In the light of the above problems, an object of the present invention is to prevent biased distribution of data by using relatively easy interleaving in a simple structure.

The present invention therefore provides an interleaving method comprising the steps of arranging data to be transmitted in a matrix, and randomly rearranging at least either columns or rows of the data and outputting the rearranged data in time series.

According to the interleaving method of this invention, data to be transmitted is rearranged by arranging the data to be transmitted in a matrix and randomly rearranging at least either columns or rows thereof, and outputted in time series, by using relatively easy interleaving even if burst errors are generated in the data to be transmitted due to an effect of fading during transmission, thereby preventing biased distribution of the data which leads to degradation of the transmission quality.

The present invention further provides a de-interleaving method comprising the steps of arranging received data having been interleaved in a matrix, and randomly rearranging at least either columns or rows of the data, and outputting the data in time series, thereby outputting the received data in the order before the received data was interleaved.

According to the de-interleaving method of this invention, received data having been interleaved is arranged in a matrix, at least either columns or rows thereof are randomly rearranged, and the data is outputted in time series, by using relatively easy de-interleaving, thereby preventing biased distribution of error data which leads to degradation of the transmission quality.

The present invention still further provides an interleaving apparatus for interleaving data to be transmitted comprising a first storing unit for storing data to be transmitted, and a first control unit for controlling the first storing unit so that the data to be transmitted is outputted from the first storing unit with the data to be transmitted arranged in a matrix and at least either columns or rows of the data to be transmitted randomly rearranged.

According to the interleaving apparatus of this invention, the first control unit controls the first storing unit to output the data to be transmitted from the first storing unit with the data to be transmitted arranged in a matrix and at least either columns or rows thereof randomly rearranged, by using relatively easy interleaving in a simple structure, thereby preventing biased distribution of error data which leads to degradation of the transmission quality.

The present invention still further provides a de-interleaving apparatus for de-interleaving received data comprising a second storing unit for storing the received data, and a second control unit for controlling the second storing unit so that the received data is outputted from the second storing unit in a state before the receive data was interleaved by arranging the received data in a matrix and randomly rearranging at least either columns or rows of the received data.

According to the de-interleaving apparatus of this invention, the second control unit controls the second storing unit to output the received data from the second storing unit in a state before the received data was interleaved by arranging the received data in a matrix and randomly rearranging at least either columns or rows thereof, by using relatively easy de-interleaving in a simple structure, thereby preventing biased distribution of error data which leads to degradation of the transmission quality.

The present invention still further provides an interleaving/de-interleaving system comprising an interleaving apparatus for interleaving data to be transmitted and a de-interleaving apparatus for receiving the transmitted data interleaved by the interleaving apparatus to de-interleave the transmitted data, wherein the interleaving apparatus outputs the data to be transmitted with the data to be transmitted arranged in a matrix and at least either columns or rows of the data to be transmitted randomly rearranged, and the de-interleaving apparatus outputs received data in a state before the transmitted data was interleaved by arranging the received data in a matrix and randomly rearranging at least either columns or rows of the received data.

According to the interleaving/de-interleaving system of this invention, the interleaving apparatus outputs the data to be transmitted with the data to be transmitted arranged in a matrix and at least either columns or rows thereof randomly rearranged, while the de-interleaving apparatus outputs received data in a state before interleaved by arranging the received data in a matrix and randomly rearranging at least either columns or rows thereof. It is thereby possible to prevent biased distribution of data relatively easily in a simple structure even if burst errors generate in interleaved data, which leads to prevention against degradation of the transmission quality.

The present invention still further provides an interleaving/de-interleaving apparatus for transmitting/receiving interleaved data to/from an opposite interleaving/de-interleaving apparatus comprising an interleaving apparatus for outputted data to be transmitted to the opposite interleaving/de-interleaving apparatus with the data to be transmitted arranged in a matrix, and at least either columns or rows of the data to be transmitted randomly rearranged, and a de-interleaving apparatus for outputting received data interleaved in the opposite interleaving/de-interleaving apparatus in a state before the received data was interleaved by arranging the received data in a matrix, and randomly rearranging at least either columns or rows of the received data.

According to the interleaving/de-interleaving apparatus of this invention, the interleaving apparatus and the de-interleaving apparatus randomly rearrange data to be transmitted and randomly rearrange received data, thereby preventing degradation of the transmission quality of the transmitted data and received data.

BRIEF DESCRIPTION OF THE DRAWINGS

FIGS. 6 through 8 are diagrams for illustrating interleaving performed in an interleaving unit according to the first embodiment of this invention;

FIG. 9 is a diagram showing data interleaved by the interleaving unit according to the first embodiment of this invention;

FIG. 15 is a diagram showing values outputted from an A column generating circuit, a one row generating circuit and an adder according to the first modification of the first embodiment of this invention;

FIG. 22 is a diagram for illustrating block interleaving;

FIGS. 23 and 24 are diagrams for illustrating random interleaving; and

FIG. 25 through 32 are diagrams for illustrating interleaving (24[4[2×2]×6[3×2]]×16[4[2×2]×4[2×2]]).

DESCRIPTION OF THE PREFERRED EMBODIMENTS (a) Description of Aspects of the Invention Hereinafter, description will be made of aspects of the present invention with reference to the drawings.

Figure 1:
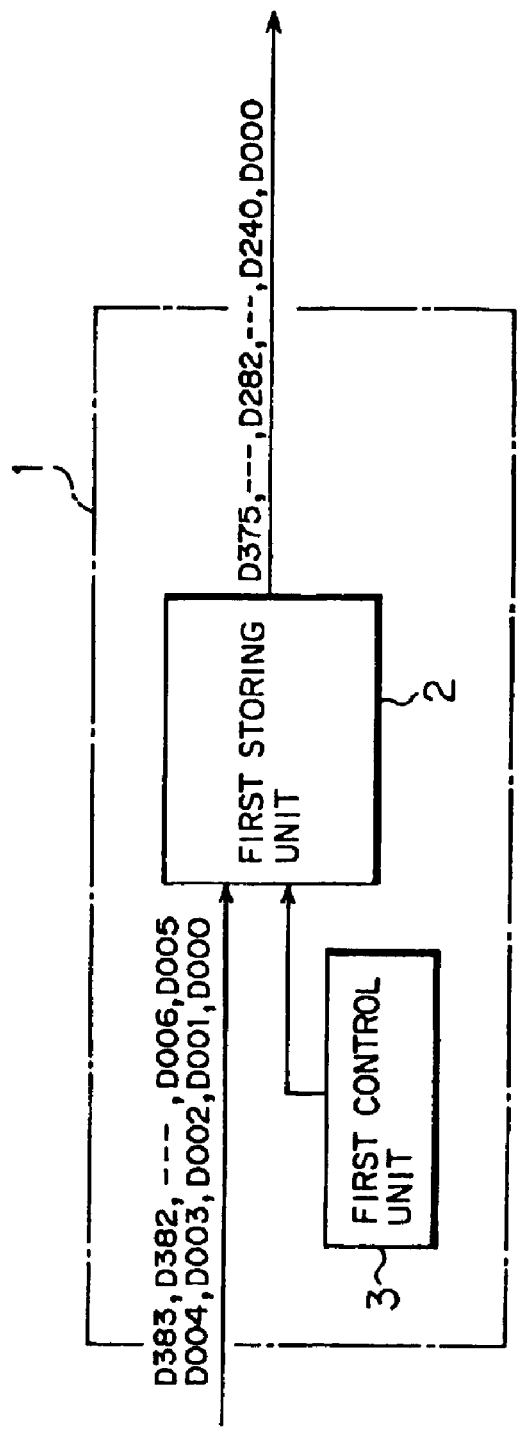
FIG. 1 is a block diagram showing an aspect of an interleaving apparatus according to this invention.

FIG. 1 is a block diagram showing an aspect of an interleaving apparatus according to this invention. In FIG. 1, an interleaving apparatus 1 interleaves data to be transmitted, which has a first storing unit 2 for storing the data to be transmitted, and a first control unit 3 for controlling the first storing unit 2 to output the data to be transmitted from the first storing unit 2 with the data to be transmitted arranged in a matrix and at least either columns or rows thereof randomly rearranged. Incidentally, data to be transmitted (D000–D383) shown in FIG. 1 is merely an example.

Accordingly, in the interleaving apparatus 1, the first control unit 3 controls the first storing unit 2 to output the data to be transmitted from the first storing unit 2 with the data to be transmitted arranged in a matrix and at least either columns or rows thereof randomly rearranged, by using relatively easy interleaving in a simple structure, thereby preventing biased distribution of error data which leads to degradation of the transmission quality.

Figure 2:
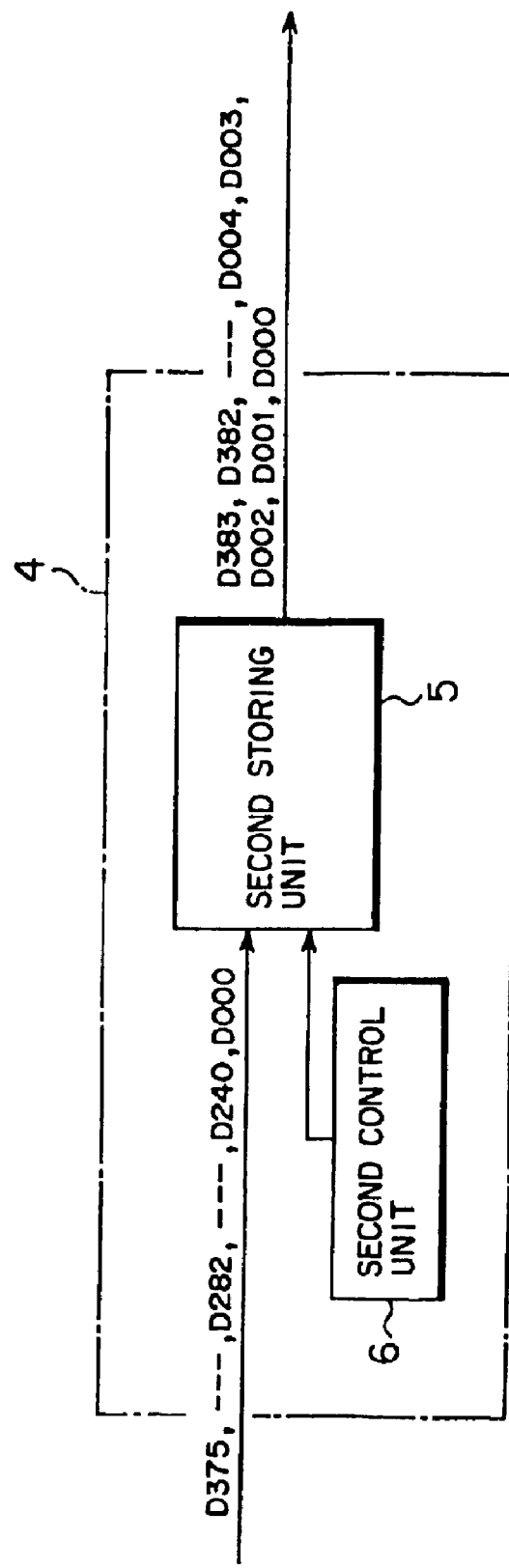
FIG. 2 is a block diagram showing an aspect of a de-interleaving apparatus according to this invention.

FIG. 2 is a block diagram showing an aspect of a de-interleaving apparatus according to this invention. In FIG. 2, a de-interleaving apparatus 4 de-interleaves received data. The de-interleaving apparatus 4 has a second storing unit 5 for storing the received data, and a second control unit 6 for controlling the second storing unit 5 to output the received data in a state before the received data was interleaved from the second storing unit 5 by arranging the received data in a matrix, and randomly rearranging at least either columns or rows thereof. Incidentally, received data (D000–D383) shown in FIG. 2 is merely an example.

Accordingly, in the de-interleaving apparatus 4, the second control unit 6 controls the second storing unit 5 to output the received data in a state before interleaved from the second storing unit 5 by arranging the received data in a matrix and randomly rearranging at least either columns or rows of thereof, by using relatively easy de-interleaving in a simple structure, thereby preventing biased distribution of error data which leads to degradation of the transmission quality.

Figure 3:
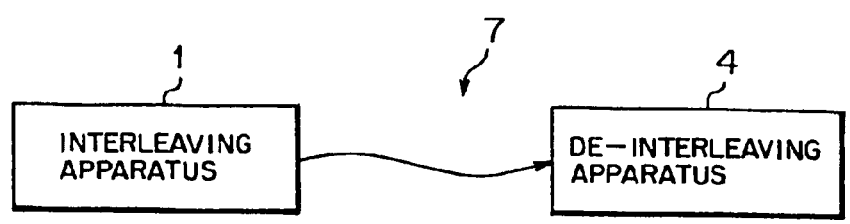
FIG. 3 is a block diagram showing an aspect of an interleaving/de-interleaving system according to this invention.

FIG. 3 is a block diagram showing an aspect of an interleaving/de-interleaving system according to this invention. In FIG. 3, an interleaving/de-interleaving system 7 has an interleaving apparatus 1 for interleaving data to be transmitted, and a de-interleaving apparatus 4 for receiving the transmitted data interleaved in the interleaving apparatus 1 to de-interleave the data, wherein the interleaving apparatus 1 outputs the data to be transmitted with the data to be transmitted arranged in a matrix, and at least either columns or rows thereof randomly rearranged, and the de-interleaving apparatus 4 outputs received data in a state before the transmitted data was interleaved by arranging the received data in a matrix, and randomly rearranging at least either columns or rows thereof.

Accordingly, in the interleaving/de-interleaving system 7, the interleaving apparatus 1 outputs the data to be transmitted with the data to be transmitted arranged in a matrix, and at least either columns or rows thereof randomly rearranged, whereas the de-interleaving apparatus 4 outputs the received data in a state before the transmitted data was interleaved by arranging the received data in a matrix, and randomly rearranging at least either columns or rows thereof, thereby preventing biased distribution of data which leads to degradation of the transmission quality, relatively readily, in a simple structure even when burst errors generate in the interleaved data.

Figure 4:
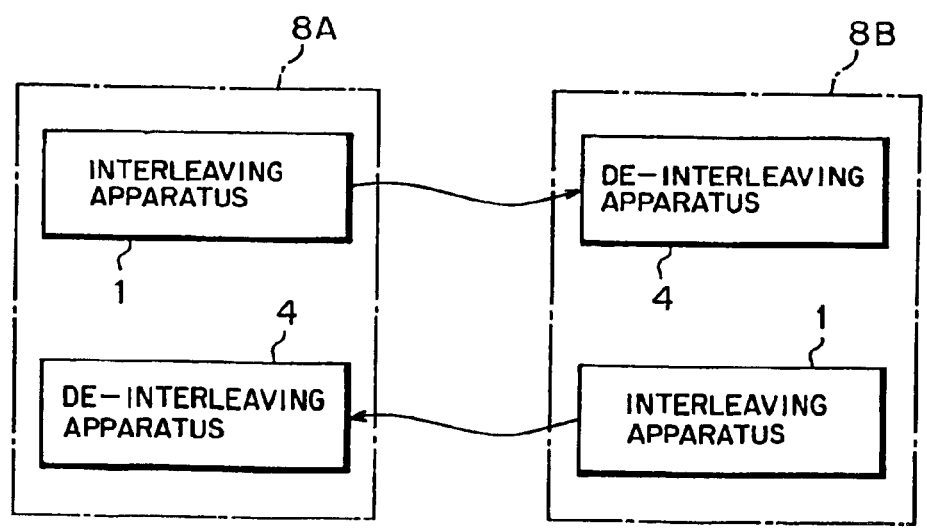
FIG. 4 is a block diagram showing an aspect of an interleaving/de-interleaving apparatus according to this invention.

FIG. 4 is a block diagram showing an aspect of an interleaving/de-interleaving apparatus according to this invention. In FIG. 4, an interleaving/de-interleaving apparatus 8A transmits/receives interleaved data to/from an opposite interleaving/de-interleaving apparatus 8B. The interleaving/de-interleaving apparatus 8A has an interleaving apparatus 1 for outputting data to be transmitted to the opposite interleaving/de-interleaving apparatus 8B with the data to be transmitted arranged in a matrix, and at least either columns or rows thereof randomly rearranged, and a de-interleaving apparatus 4 for outputting received data having been interleaved in the opposite interleaving/de-interleaving apparatus 8B in a state before the received data was interleaved by arranging the received data in a matrix, and randomly rearranging at least either columns or rows thereof.

Accordingly, in the interleaving/de-interleaving apparatus 8A or 8B, the interleaving apparatus 1 and the de-interleaving apparatus 4 randomly rearrange data to be transmitted, and randomly rearrange an array of received data, thereby preventing degradation of the transmission quality of the data to be transmitted and the received data.

(b) Description of Embodiments of the Invention

Hereinafter, embodiments of this invention will be described with reference to the drawings.

(b1) Description of a First Embodiment

A first embodiment will be described by way of an example in which a mobile station and a base station carry out CDMA (Code Division Multiple Access) connection using a spread spectrum technique in a portable telephone system.

The following description will be made in the case where signals are transmitted/received between each mobile station (MS) and the base station (BS).

Figure 5:
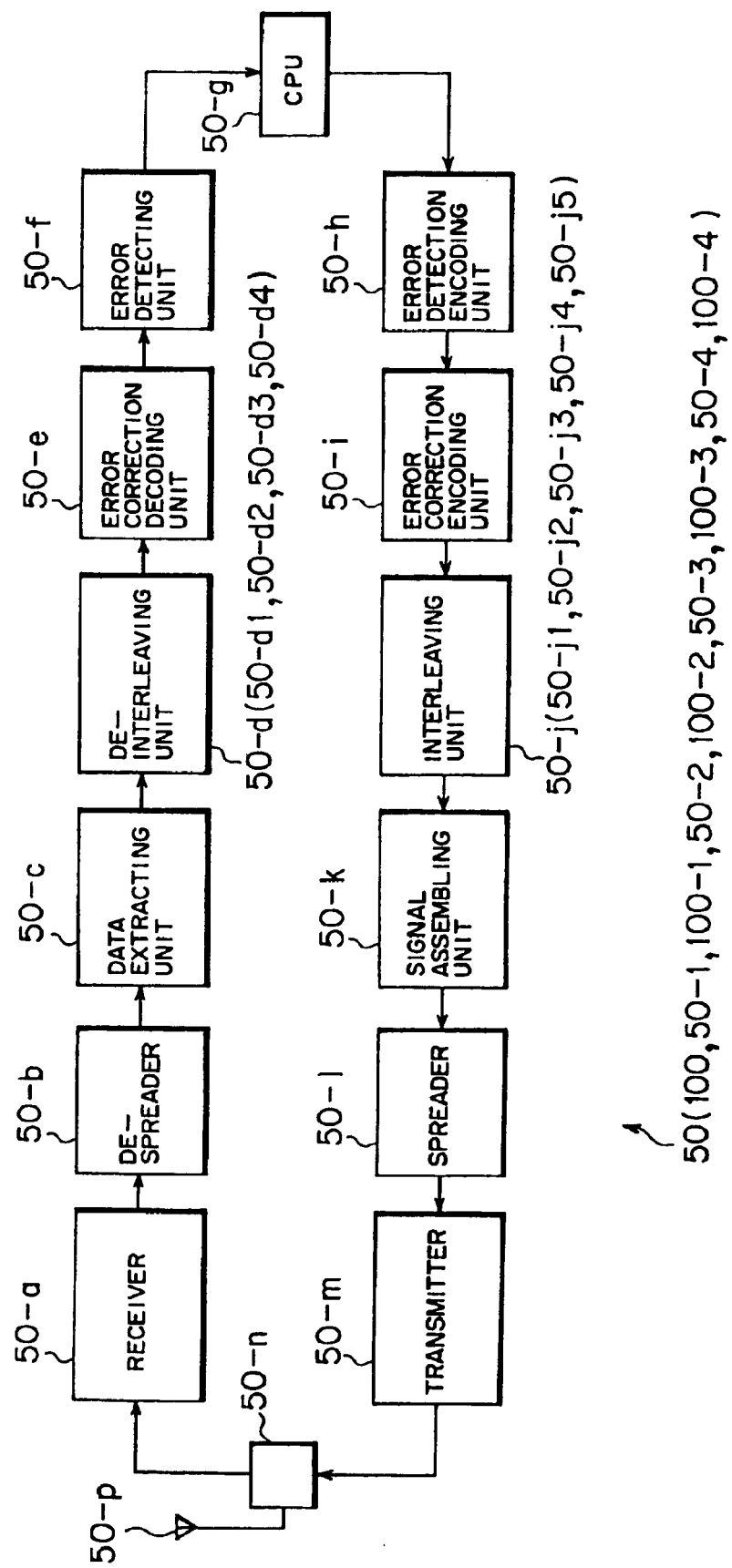
FIG. 5 is a block diagram showing a structure of an MS according to a first embodiment of this invention.

FIG. 5 is a block diagram showing a structure of an MS according to the first embodiment. As shown in FIG. 5, the MS 50 comprises a receiver 50-*a*, a de-spreader 50-*b*, a data extracting unit 50-*c*, a de-interleaving unit 50-*d*, an error correction decoding unit 50-*e*, an error detecting unit 50-*f*, a CPU 50-*g*, an error detection encoding unit 50-*h*, an error correction encoding unit 50-*i*, an interleaving unit 50-*j*, a signal assembling unit 50-*k*, a spreader 50-*l*, a transmitter 50-*m*, a duplexer 50-*n* and an antenna 50-*p*.

The receiver 50-*a* modifies a signal received via the antenna 50-*p* and the duplexer 50-*n* into a signal easily processable by the de-spreader 50-*l*.

For example, the receiver 50-*a* not only down-converts a signal (radio frequency received signal: RF signal) received via the antenna 50-*p* and the duplexer 50-*n* into an intermediate frequency signal (IF signal) to separate the signal into I channel components and Q channel components, but also converts each of the components (I channel components and Q channel components) from analog to digital to generate a digital signal.

Next, the de-spreader 50-*b* separates a desired signal from a digital signal sent from the receiver 50-*a* using a de-spreading code. The data extracting unit 50-*c* extracts data from the signal separated by the de-spreader 50-*b*.

The error correction decoding unit 50-*e* decodes data de-interleaved by the de-interleaving unit 50-*d*, and corrects an error included in the data using an error correcting code. For example, an error is corrected using a parity check bit added when data (main signal) is transmitted, and the parity check bit is deleted in decoding and correcting.

The error detecting unit 50-*f* detects an error detecting bit added when the data (main signal) is transmitted on the basis of a bit structure of the error detecting bit previously set. Information or data about an error or the like detected by the error detecting unit 50-*f* is notified the CPU 50-*f*.

The error detection encoding unit 50-*h* encodes the error detecting bit to be used to detect an error and adds the error detecting bit to data sent from the CPU 50-*g*. The error correction encoding unit 50-*i* adds the error correcting code, which is to be used for error correction, to the data sent from the error detection encoding unit 50-*h*.

The signal assembling unit 50-*k* assembles interleaved data to form a signal format suited for transmission. The spreader 50-1 converts a signal sent from the signal assembling unit 50-*k* into a spread signal using a predetermined spreading code.

The transmitter 50-*m* modifies a signal sent from the spreader 50-1 into a signal to be transmitted.

For example, the transmitter 50-*m* converts each component (I channel or Q channel) of a digital signal sent from the spreader 50-1 into an analog signal in digital/analog conversion. The transmitter 50-*m* up-converts an intermediate frequency signal (IF signal) into a radio frequency signal (RF signal) after orthogonal-modulating the signal into an orthogonal-modulated signal.

The radio frequency signal is transmitted to the outside via the duplexer 50-*n* and the antenna 50-*p*.

The interleaving unit (interleaving apparatus) 50-*j* interleaves data to be transmitted.

In concrete, the interleaving unit 50-*j* arranges data to be transmitted in a matrix, randomly rearranges rows and columns of the data, and outputs the rearranged data in time series.

Assuming that a series of data to be transmitted consists of 384 (000–383) of data.

The data (000–383) is, as shown in FIG. 6, arranged in a matrix (16 columns by 24 rows), after that, columns of the data are rearranged, as shown in FIG. 7. As shown in FIG. 6, the columns (A to P) are arranged in alphabetical order, but the data is rearranged in the order of A, P, J, . . . and so on by rearranging the columns of the data, as shown in FIG. 7.

After that, the rows of the data (000–383) are rearranged, as shown in FIG. 8. As shown in FIG. 7, the rows (1–24) are arranged in the order numbered, but the rows are rearranged in the order of 1, 16, 19, 10, 17, . . . and so on by the rearranging the rows, as shown in FIG. 8.

Figure 9:
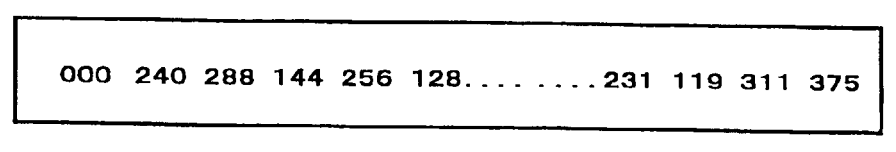

The data arranged in a matrix as shown in FIG. 8 is read out in order column by column, beginning with "000" in column A, whereby the order in which the data has been arranged is randomly rearranged. Namely, the read data is irregularly rearranged, as shown in FIG. 9.

Figure 10:
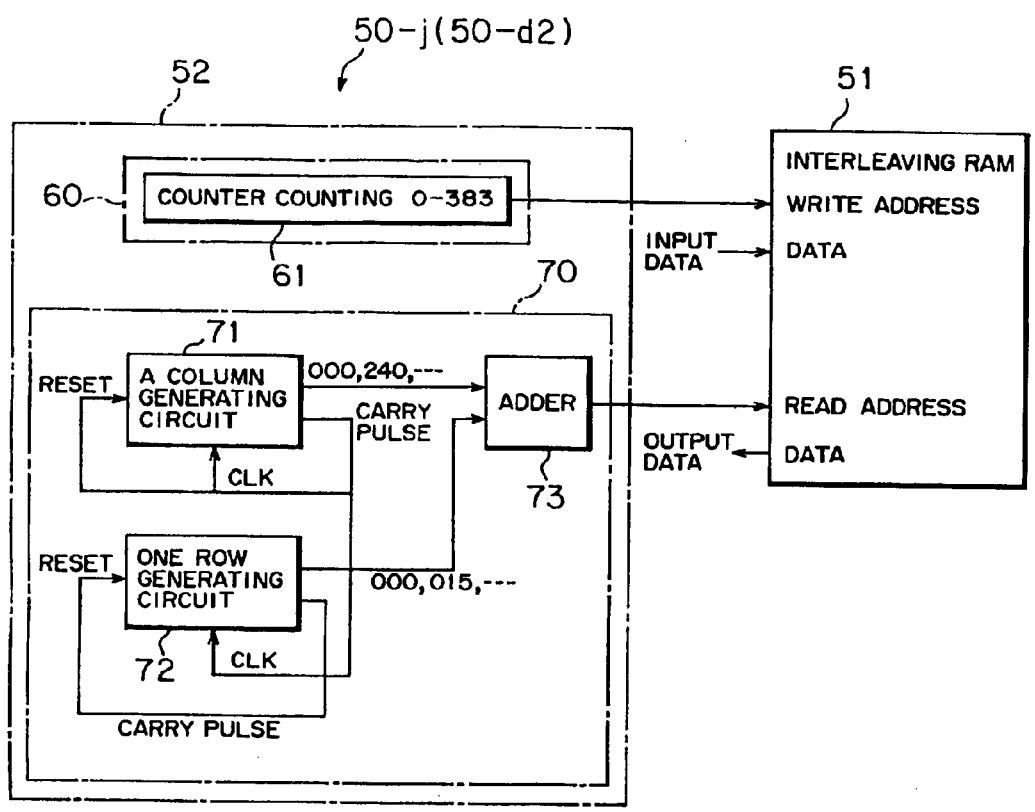
FIG. 10 is a block diagram showing an interleaving apparatus according to the first embodiment of this invention.

FIG. 10 is a block diagram showing the interleaving apparatus 50-*j* according to the first embodiment of this invention. As shown in FIG. 10, the interleaving apparatus 50-*j* comprises an interleaving RAM (Random Access Memory) 51 and a control processing unit 52.

The interleaving RAM (first storing unit) (hereinafter referred as "first RAM 51") stores data to be transmitted.

The control processing unit (first control unit) 52 (hereinafter referred as "first control processing unit") controls the first RAM 51 so that the data to be transmitted is transmitted from the first RAM 51 with the data to be transmitted arranged in a matrix and rows or columns thereof randomly rearranged.

To this end, the first control processing unit 52 comprises a write processing unit 60 (hereinafter referred as "first write processing unit") and a read processing unit 70 (hereinafter referred as "first read processing unit 70).

The first write processing unit 60 performs a control to write data in the first RAM 51, which outputs an address and an enable signal (not shown) The first writing processing unit 60 writes signals sent from the error correction encoding unit 50-*i* in order of addresses.

To this end, the first write processing unit 60 comprises a counter 61, as shown in FIG. 10. The counter 61 generates count values from "0" to "383". The counter 61 counts up the value in ascending order, and again counts from "0" when the count value reaches the maximum value.

Each of the count values (0–383) is used as an address for input data. The first data "000", for example, is stored in the 0th address with a count value "0" outputted from the counter 61 as an address. The 107th data is stored in the 106th address with a count value "106" as an address.

The read processing unit (first read processing unit) 70 generates an address used to read the data to be transmitted from the first RAM 51 with the data to be transmitted stored in the first RAM 51 arranged in a matrix and columns and rows thereof randomly rearranged, so as to read the data.

The first read processing unit 70 reads the data (refer to FIG. 6) having been arranged in a matrix and held in the first RAM 51 from the first RAM 51 in a data array shown in FIG. 9.

To this end, the first read processing unit 70 comprises an A column generating circuit 71, a one row generating circuit 72 and an adder 73.

The A column generating circuit (column number generating unit) 71 randomly generates a column number, which generates any one of 24 numbers (a multiplex of 16 or 000 among 000–383) in column A shown in FIG. 8. The A column generating circuit 71 generates 24 numbers in column A within one cycle, then is reset when completing generation of 24 numbers and shifting to the next cycle, and again outputs 24 numbers in column A. Additionally, the A column generating circuit 71 outputs a carry pulse to the one row generating unit 72 when the cycle is changed.

The one row generating unit (row number generating unit) 72 generates a row number, which generates any one of 16 numbers (000–015) in one row shown in FIG. 8. The one row generating unit 72 randomly changes row numbers to be outputted each time all 24 column numbers in column A are outputted (in each cycle of the A column generating circuit 71). When the one row generating circuit 72 completes generation of 16 numbers (000–015), the one row generating circuit 72 is reset, thereby again outputting 16 numbers in one row.

The adder 73 outputs a value obtained by adding numbers outputted from the A column generating circuit 71 and the one row generating circuit 72 as a read address for the first RAM 51.

Table 1 below shows an example of data outputted from the A column generating circuit 71, the one row generating circuit 72 and the adder 73.

TABLE 1

| | Example of output data | | | | | | | | | | | |
|---|---|---|---|---|---|---|---|---|---|---|---|---|
| | t1 | t2 | t3 | ... | t22 | t23 | t24 | t25 | t26 | t27 | ... | t46 | t47 |
| Output of A column generating circuit | 000 | 240 | 288 | ... | 112 | 304 | 368 | 000 | 240 | 288 | ... | 112 | 304 |
| Output of one row generating circuit | 000 | 000 | 000 | ... | 000 | 000 | 000 | 015 | 015 | 015 | ... | 015 | 015 |
| Output of adder | 000 | 240 | 288 | ... | 112 | 304 | 368 | 015 | 255 | 303 | ... | 127 | 319 |

As shown in Table 1 above, during timings t1 to t24, the A column generating circuit 71 outputs a different column number at each timing, whereas the one row generating circuit 72 outputs the same row number. At a timing t25 when 24 numbers having been outputted from the A column generating circuit 72 have taken a round, the one row generating circuit 72 outputs the next number. While numbers sent from the A column generating circuit 71 are taking a round (one cycle), the same number is outputted from the one row generating circuit 72. Only after numbers for 24 cycles are outputted from the A column generating circuit 71, the one row generating circuit 72 completes outputting of numbers (16 numbers from 000 to 015) for one cycle.

Although numbers or the like outputted from the circuits 71 and 72, and the adder 73 after a timing t47 in Table 1 above, the A column generating circuit 71 outputs 24 numbers in a cycle, whereas the one row generating circuit 72 outputs the same number in the same cycle, and outputs a different number each time the cycle is changed.

When attention is given to a timing t26 in Table 1 above, a value (read address) outputted from the adder 73 is a sum of "240" outputted from the A column generating circuit 71 and "015" outputted from the one row generating circuit 72.

Figure 11:
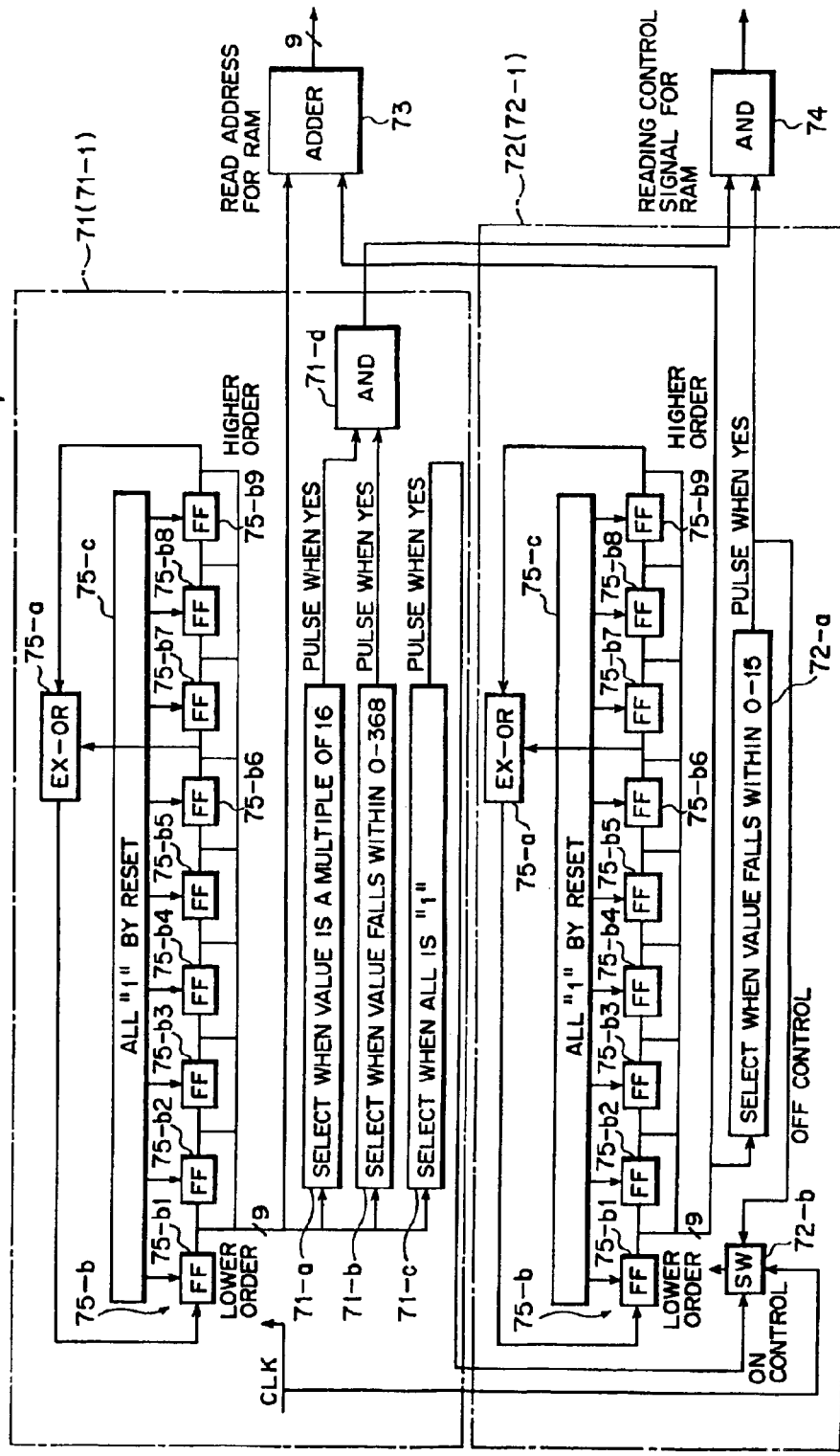
FIG. 11 is a block diagram showing a detailed structure of a first RAM read processing unit according to the first embodiment of this invention.

FIG. 11 is a diagram showing a detailed structure of the first read processing unit 70 according to the first embodiment of this invention. The first read processing unit 70 shown in FIG. 11 comprises the A column generating circuit 71, the one row generating circuit 72, the adder 73 and an AND circuit 74.

The A column generating circuit 71 comprises, as shown in FIG. 11, an EX-OR (exclusive OR) circuit (hereinafter referred merely as "EX-OR") 75-*a*, a shift register 75-*b*, a setting control unit 75-*c*, a first selecting circuit 71-*a*, a second selecting circuit 71-*b*, a third selecting circuit 71-*c* and an AND circuit 71-*d*. The A column generating circuit 71 generates 24 numbers (refer to FIG. 8) in column A using data of 9 bits.

The shift register 75-*b* holds data of 9 bits, which comprises flip-flops (hereinafter referred as "FF") 75-*b*1 through 75-*b*9.

The FFs 75-*b*1 through 75-*b*9 each holds a bit of "1 (High)" when activated under a control of the setting control unit 75-*c* performing a control when the apparatus is activated.

Data held in the shift register 75-*b* is successively shifted according to a clock (CLK). Bits outputted from the FF 75-*b*9 and the FF 75-*b*6 undergo an exclusive-OR operation in the EX-OR 75-*a*, then a resulting bit is held as a lower bit in the FF 75-*b*1.

Table 2 below shows an example of transition of a bit structure held in the shift register 75-*b*

TABLE 2

Example of transition of a bit structure

| Lower Order | Higher Order | | | |
|---|---|---|---|---|
| 111111111 | 001111111 | 000011111 | 000000111 | 110000001 |
| 011111111 | 000111111 | 000001111 | 100000011 | |

The first selecting circuit 71-*a* determines whether or not a numerical value represented by data (binary number) of 9 bits corresponds to a multiple of 16 and 0 as decimal numbers. In concrete, the first selecting circuit 71-*a* determines whether or not lower 4 bits among 9 bits are all "0". When the lower 4 bits are all "0", the first selecting circuit 71-*a* outputs a pulse (described as ""pulse when YES" in FIG. 11).

The second selecting circuit 71-*b* determines whether or not a numerical value represented by data (binary number) of 9 bits is any numerical value among 0 to 368 as decimal numbers.

The third selecting circuit 71-*b* determines whether or not the 9 bits are all "1 (High)". When the 9 bits are all "1", the third selecting circuit 71-*b* outputs a pulse (carry pulse) (described as "pulse when YES" in FIG. 11).

Next, the one row generating circuit 72 shown in FIG. 11 comprises, similarly to the A column generating circuit 71, an EX-OR 75-*a*, a shift register 75-*b* and a setting control unit 75-*c*. In addition, the one row generating circuit 72 comprises a fourth selecting circuit 72-*a* and a switch (SW) 72-*b*.

The switch 72-*b* performs a control to send a clock (CLK) signal to the shift register 75-*b* according to a pulse outputted from the third selecting circuit 71-*c* or the fourth selecting circuit 72-*a*. When receiving a pulse signal from the third selecting circuit 71-*c*, the switch 72-*b* sends a clock signal to the shift register 75-*b* (ON control) When receiving a pulse signal from the fourth selecting circuit 72-*a*, the switch 72-*b* prevents a clock signal from passing therethrough (OFF control).

The fourth selecting circuit 72-*a* determines whether or not a numerical value represented by data (binary number) of 9 bits corresponds to any one of 0 to 15 as decimal numbers. In concrete, the fourth selecting circuit 72-*a* determines whether or not bits higher than lower 5 bits among the 9 bits include "1". When the bits higher than the lower 5 bits do not include "1", the fourth selecting circuit 72-*a* outputs a pulse signal (described as "pulse when YES" in FIG. 11).

Figure 12:
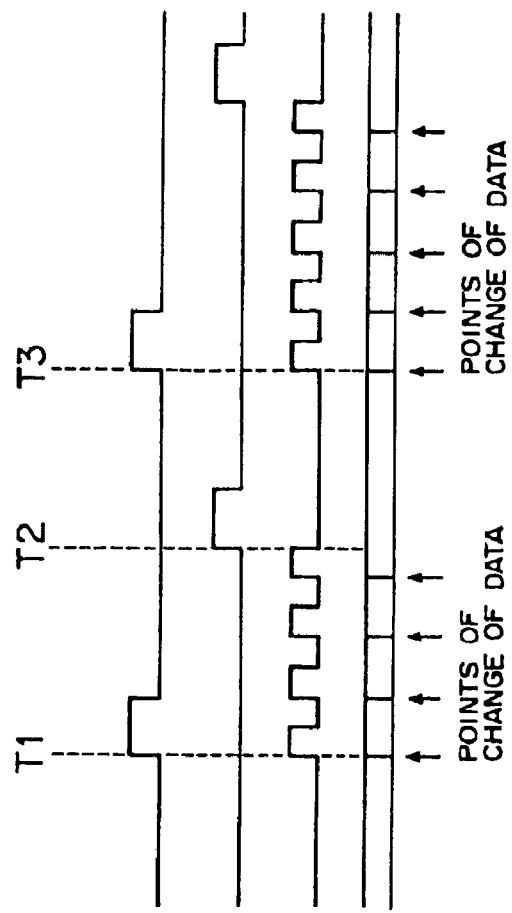
FIGS. 12(a) through 12(d) are time charts for illustrating a schematic operation of a shift register in a one row generating circuit according to the first embodiment of this invention.

FIGS. 12(*a*) through 12(*d*) are time charts for illustrating a schematic operation of the shift register 75-*b* in the one row generating circuit 72. FIG. 12(*a*) shows a timing at which a pulse signal is outputted from the third selecting circuit 71-*c*. FIG. 12(*b*) shows a timing at which a pulse signal is outputted from the fourth selecting circuit 72-*a*. FIG. 12(*c*) shows a timing at which a clock signal is outputted from the switch 72-*b*. FIG. 12(*d*) is a time chart showing transition timings for data held in the shift register 75-*b*.

As shown in FIG. 12(*a*), when a pulse signal is outputted from the third selecting circuit 71-*c* at a timing T1, the switch 72-*b* sends a clock signal to the shift register 75-*b* in ON control [refer to FIG. 12(*c*)]. Each time the shift register 75-*b* receives a clock via the switch 72-*b*, the shift register 75-*b* shifts the data to change the data structure of 9 bits held therein [described as "points of change of data" in FIG. 12(*d*)].

On the other hand, as shown in FIG. 12(*b*), when a pulse signal is outputted from the fourth selecting circuit 72-*a* at a timing T2, the switch 72-*b* changes its state from where the switch 72-*b* sends a clock signal before the timing T2 to where the switch 72-*b* does not send a clock signal to the shift register 75-*b* [refer to FIG. 12(*c*)], so that the shift register 75-*b* does not shift the data but keeps the preceding state (does not change the data).

After that, when a pulse signal is outputted from the third selecting circuit 71-*c* at a timing T3, the shift register 75-*b* shifts the data to change the bit structure in a similar way to the above.

The AND circuit shown in FIG. 11 performs a control to output an enable signal to be used to read data stored in an address outputted from the adder 73. When values (numbers) outputted from the A column generating circuit 71 and the one row generating circuit 72 are predetermined values, respectively, the AND circuit 74 outputs an enable signal.

In concrete, when a value sent from the A column generating circuit 71 to the adder 73 corresponds to a multiple of "16" (decimal number) and any one of "0 to 368 (decimal numbers)", the first selecting circuit 71-*a* and the second selecting circuits 71-*b* output pulse signals to the AND circuit 71-*d*, and the AND circuit 71-*d* outputs a pulse signal to the AND circuit 74.

When a value sent from the one row generating circuit 72 to the adder 73 corresponds to any one of "0 to 15 (decimal numbers)", the fourth selecting circuit 72-*a* outputs a pulse signal to the AND circuit 74.

The AND circuit 74 outputs an enable signal to the first RAM 51 when receiving pulse signals from the AND circuit 71-*d* and the fourth selecting circuit 72-*a*.

For example, "255" outputted from the adder 73 to the first RAM 51 at a timing t26 in the foregoing Table 1 is used as an effective read address by that an enable signal is outputted from the AND circuit 74 to the first RAM 51 on the basis of pulse signals outputted from the AND circuit 71-*d* and the fourth selecting circuit 72-*a*, whereby the data stored at an address "255" is read out.

The A column generating circuit 71 and the one row generating circuit 72 shown in FIG. 10 are reset. However, in the structure shown in FIG. 11, the A column generating circuit 71 and the one row generating circuit 72 are not reset every cycle. Namely, the bit structure of the shift register 75-*b* becomes all "1" when a predetermined time is elapsed.

The de-interleaving unit (de-interleaving apparatus) 50-*d* shown in FIG. 5 de-interleaves received data.

In concrete, the de-interleaving unit 50-*d* arranges received data having been interleaved in a matrix, randomly rearranges at least either columns or rows of the data, and outputs the data in time series, thereby outputting the received data in the order before the received data was interleaved.

In the case of the 384 of data (000–383) (refer to FIG. 9) interleaved by an interleaving unit 50-*j* in an another apparatus and sent from the another apparatus, the received data (000–383) is rearranged in the order before the received data was interleaved.

Figure 13:
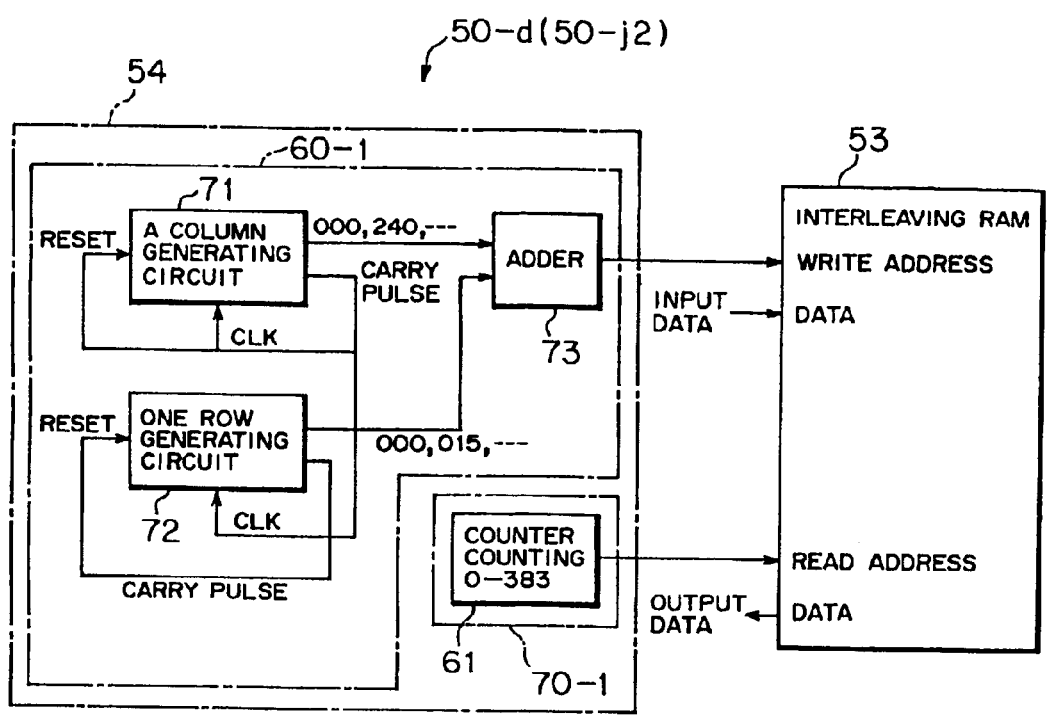
FIG. 13 is a block diagram showing a de-interleaving apparatus according to the first embodiment of this invention.

FIG. 13 is a block diagram showing the de-interleaving apparatus 50-*d* according to the first embodiment of this invention. As shown in FIG. 13, the de-interleaving apparatus 50-*d* comprises an interleaving RAM 53 and a control processing unit 54.

The interleaving RAM (second storing unit) 53 (hereinafter referred as "second RAM 53") stores received data.

The control processing unit (second control unit) 54 (hereinafter referred as "second control processing unit 54") controls the second RAM 53 so that the received data is outputted from the second RAM 53 in a state before the received data was interleaved by arranging the received data in a matrix and randomly rearranging columns and rows thereof.

To this end, the second control processing unit 54 comprises a write processing unit 60-1 (hereinafter referred as "second write processing unit 60-1") and a read processing unit (hereinafter referred as "second read processing unit 70-1").

The write processing unit (second write processing unit) 60-1 generates an address used to write the received data in the second RAM 53 in a state before the received data was interleaved by arranging the received data in a matrix and randomly rearranging columns and rows thereof, thereby writing the received data.

For example, the write processing unit 60-1 performs a data writing control so that received data having been interleaved (refer to FIG. 9) is stored in the second RAM 53 in a state of the matrix shown in FIG. 6 by rearranging columns and rows thereof.

To this end, the second write processing unit 60-1 comprises, as shown in FIG. 13, an A column generating circuit 71, a one row generating circuit 72 and an adder 73.

The second write processing unit 60-1 comprising the A column generating circuit 71, the one row generating circuit and the adder 73 may, as shown in FIG. 11, also comprises an EX-OR 75-*a*, a shift register 75-*b*, a setting control unit 75-*c*, a first selecting circuit 71-*a*, a second selecting circuit 71-*b*, a third selecting circuit 71-*c*, an AND circuit 71-*d*, a fourth selecting circuit 72-*a* and a switch (SW) 72-*b*, similarly to the above read processing unit 70. In the de-interleaving unit 50-*d* so structured, a number outputted from the adder 73 shown in FIG. 13 is used as a write address, as shown in FIG. 13.

The second read processing unit 70-1 shown in FIG. 13 reads data from the second RAM 53, outputs an address and an enable signal (not shown), and comprises a counter 61, as shown in FIG. 13.

Data read out from the second RAM 53 on the basis of a count value "0–383" which is sent from the counter 61 in the second read processing unit 70-1 is read out in numerical order as "000", "001", "002", "003", . . . , "150", . . . , 250", . . . , "382" and "383".

Since the MS 50 comprises the interleaving unit 50-*j* and the de-interleaving unit 50-*d*, the MS 50 has a function as an interleaving/de-interleaving apparatus which transmits/receives interleaved data to/from an opposite interleaving/de-interleaving apparatus.

The BS performing CDMA communication with the MS 50 transmits/receives data to/from the MS 50.

Now, the following description will be made by way of an example where interleaved data spread using the same spreading code is transmitted between the MS 50 and the BS in CDMA communication, and received data de-spread using the same de-spreading code is de-interleaved.

The BS 100 comprises, as shown in FIG. 5, a receiver 50-*a*, a de-spreader 50-*b*, a data extracting unit 50-*c*, a de-interleaving unit (de-interleaving apparatus) 50-*d*, an error correction decoding unit 50-*e*, an error detecting unit 50-*f*, a CPU 50-*g*, an error detection encoding unit 50-*h*, an error correction encoding unit 50-*i*, an interleaving unit (interleaving apparatus) 50-*j*, a signal assembling unit 50-*k*, a spreader 50-1, a transmitter 50-*m*, a duplexer 50-*n* and an antenna 50-*p*, similarly to the foregoing MS 50.

Meanwhile, when CDMA communication uses a plurality of spreading codes, the BS 100 may be provided with the de-spreader 50-*b* and the spreader 50-1 for each spreading code. Additionally, in order to process received data and data to be transmitted for each spreading code, the BS 100 may be provided with the data extracting unit 50-*c*, the de-interleaving unit 50-*d*, the error correction decoding unit 50-*e*, the error detecting unit 50-*f*, the error detection encoding unit 50-*h*, the error correction encoding unit 50-*j*, the interleaving unit 50-*h* and the signal assembling unit 50-*k*.

According to the MS 50 and the BS 100 each with the above structure according to the first embodiment, when the MS 50 transmits data to the BS 100, the MS 50 randomly rearranges columns and rows of data to which an error correcting code is added in the error correction encoding unit 50-*i* by the interleaving unit 50-*j*, and outputs the data in a state as shown in FIG. 9 to the signal assembling unit 50-*k*.

The interleaved data is assembled into a predetermined transmit data length by the signal assembling unit 50-*k*, then spread using a predetermined spreading code by the spreader 50-1. The spread interleaved data (digital signal) is converted or the like into an RF signal by the transmitter 50-*m*, then transmitted to the outside via the duplexer 50-*n* and the antenna 50-*p*.

On the other hand, when the BS 100 receives the RF signal transmitted from the MS 50 via the antenna 50-*p* and the duplexer 50-*n*, the receiver 50-*a* converts or the like the RF signal into a digital signal, and the de-spreader 50-*b* de-spreads the signal using a predetermined de-spreading code. After that, the data extracting unit 50-*c* extracts data having been interleaved by the interleaving unit 50-*j* in the MS 50, and the de-interleaving unit 50-*d* randomly rearranges columns and rows of the interleaved data to arrange the data in the order of before the interleaved data was interleaved, and sends the data to the error correction decoding unit 50-*e*.

The error correction decoding unit 50-*e* corrects a correctable error using an error correction code, and notifies of information on the error detected by the error detecting unit 50-*f* the 5 CPU 50-*g*.

A processing on data to be transmitted from the BS 100 to the MS 50 is similar to the above, detailed description of which is omitted here.

According to the MS 50 and the BS 100 according to the first embodiment of this invention, even if data transmitted, for example, from the MS 50 to the BS 100 is affected by fading during transmission so that an error generates, the MS 50 on the transmitting side rearranges the data using relatively easy interleaving in a simple structure when transmitting the data so that distribution of the data is not biased, and transmits the data, and the BS 100 on the receiving side makes distribution of the error data be without bias using relatively easy de-interleaving in a simple structure when receiving the interleaved data, thereby preventing degradation of the transmission quality.

(b1-1) Description of a First Modification of the First Embodiment

Next, a first modification of the first embodiment will be described with reference to FIG. 5. An MS 50-1 and a BS 100-1 according to the first modification of the first embodiment has similar functions to the MS 50 and the BS 100 according to the first embodiment. In contrast to the de-interleaving unit 50-*d* according to the first embodiment which randomly generates an address when received data is written in the second RAM 53, a de-interleaving unit according to the first modification of the first embodiment randomly generates an address used to read the data.

In the description of the first modification of the first embodiment, like reference characters designate like or corresponding parts in the first embodiment.

Figure 14:
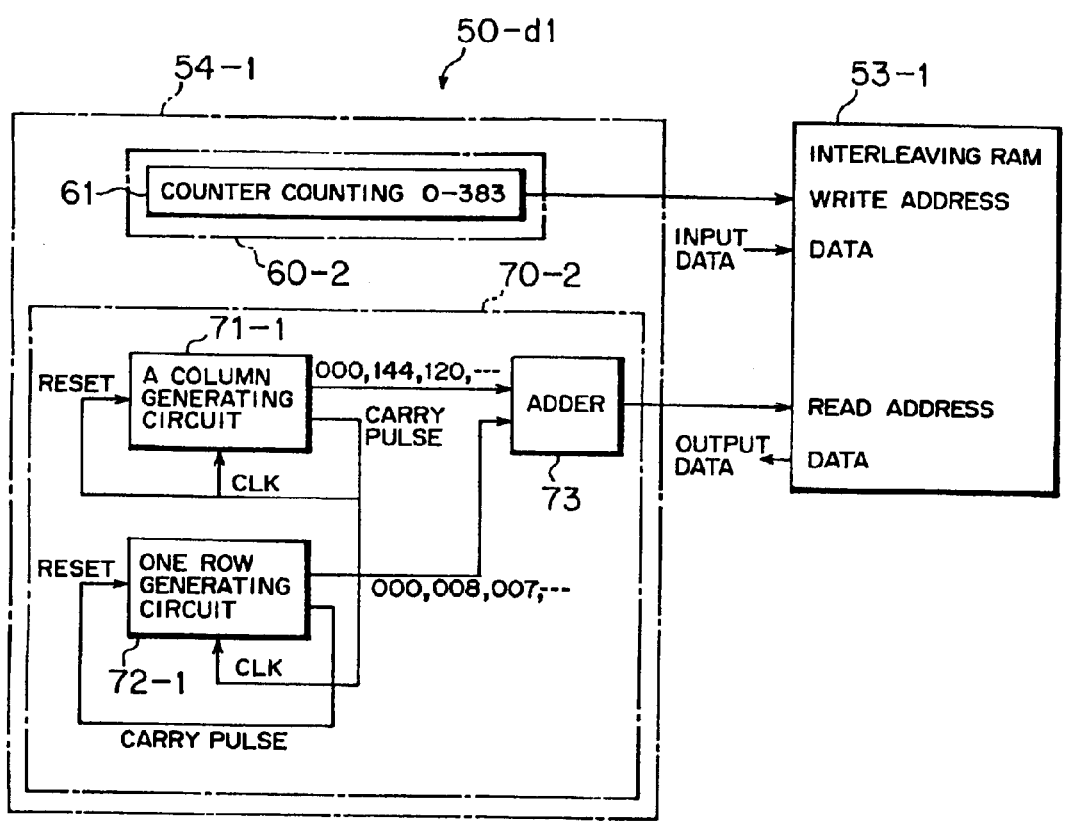
FIG. 14 is a block diagram showing a structure of a de-interleaving unit according to a first modification of the first embodiment of this invention.

FIG. 14 is a diagram showing a structure of a de-interleaving unit 50-*d*1 according to the first modification of the first embodiment of this invention. As shown in FIG. 14, the de-interleaving unit 50-*d*1 comprises a second RAM 53-1 and a control processing unit 54-1.

The second RAM 53-1 stores received data, similarly to the second RAM 53.

The control processing unit (second control unit) 54-1 performs a control on the second RAM 53-1 so that received data is outputted from the second RAM 53-1 in a state before the received data was interleaved by arranging the received data in a matrix and randomly rearranging columns and rows thereof, in a similar way to the second control processing unit 54 according to the first embodiment.

To this end, the control processing unit 54-1 comprises, as shown in FIG. 14, a write processing unit 60-2 (hereinafter referred as "third write processing unit 60-2") and a read processing unit 70-2 (hereinafter referred as "third read processing unit 70-2").

The third write processing unit 60-2 has a similar function to the first write processing unit 60 according to the first embodiment, which performs a control to write data in the second RAM 53-1, and outputs an address and an enable signal (not shown) The third write processing unit 60-2 comprises a counter 61.

On the other hand, the third read processing unit (second read processing unit) 70-2 generates a read address used to read the received data from the second RAM 53-1 in a state before the received data was interleaved by arranging the received data written in the second RAM 53-1 in a matrix and randomly rearranging columns and rows thereof.

To this end, the third read processing unit 70-2 comprises an A column generating circuit 71-1, a one row generating circuit 72-1 and an adder 73.

Although the A column generating circuit 71-1 has a similar function to the A column generating circuit 71 according to the first embodiment, the A column generating circuit 71-1 generates numbers different from those generated by the A column generating circuit 71.

In concrete, as contrasted with the A column generating circuit 71 generating 24 numbers, the A column generating circuit 71-1 generates 16 numbers. However, the numbers generated by the A column generating circuit 71 and the numbers generated by the A column generated circuit 71-1 are different from each other. The numbers generated by the A column generating circuit 71-1 are "000", "144", "120", "216", "096", "312", "192", "360", "072", "048", "288", "240", "168", "264", "336" and "024", when described in the order generated.

Although the one row generating circuit 72-1 has a similar function to the one row generating circuit 72 according to the first embodiment, numbers generated by the one row generating circuit 72-1 are different from those generated by the one row generating circuit 72.

In concrete, the one row generating circuit 72 generates 16 numbers, whereas the one row generating circuit 72-1 generates 24 numbers. Furthermore, numbers generated by the one row generating circuit 72 and the one row generating circuit 72-1 are different from each other. The numbers generated by the one row generating circuit 72-1 are "000", "008", "007", "013", "006", "019", "012", "021", "005", "003", "018", "015", "011", "016", "020", "010", "004", "0091", "002", "022", "017", "010", "014" and "023", when described in the order generated.

FIG. 15 is a diagram showing values outputted from the A column generating circuit 71-1, the one row generating circuit 72-1 and the adder 73. As shown in FIG. 15, a value obtained by adding values outputted from the A column generating circuit 71-1 and the one row generating circuit 72-1 is outputted from the adder 73, and used as a read address.

When 16 numbers are completed to be outputted from the A column generating circuit 71-1, the one row generating circuit 72-1 outputs a different number, as shown in FIG. 15. Broken line a shown in FIG. 15 shows a change of the data outputted from the one row generating circuit 72-1.

The A column generating circuit 71-1 and the one row generating circuit 72-1 according to the first modification may be configured in a similar way to the A column generating circuit 71 and the one row generating circuit 72 shown in FIG. 11, respectively. However, the first selecting circuit 71-*a* selects a multiple of "24", while the fourth selecting circuit 72-*a* outputs a pulse signal when the value falls within "0–23".

According to the MS 50-1 and the BS 100-1 with the foregoing structures, data interleaved in the MS 50-1 is rearranged in the order before the interleaved data was interleaved by the de-interleaving unit 50-*d*1 in the BS 100-1.

According to the MS 50-1 and the BS 100-1 according to the first embodiment of this invention, even if data transmitted from the MS 50-1 to the BS 100-1 is affected by fading that errors are generated in the transmitted data, for example, the MS 50-1 on the transmitting side having a simple structure rearranges the data using relatively easy interleaving so that distribution of the errors is not biased, while the BS 100-1 on the receiving side having a simple structure makes the distribution of the errors of the data be not biased when receiving the interleaved data, thereby preventing degradation of the transmission quality.

Figure 16:
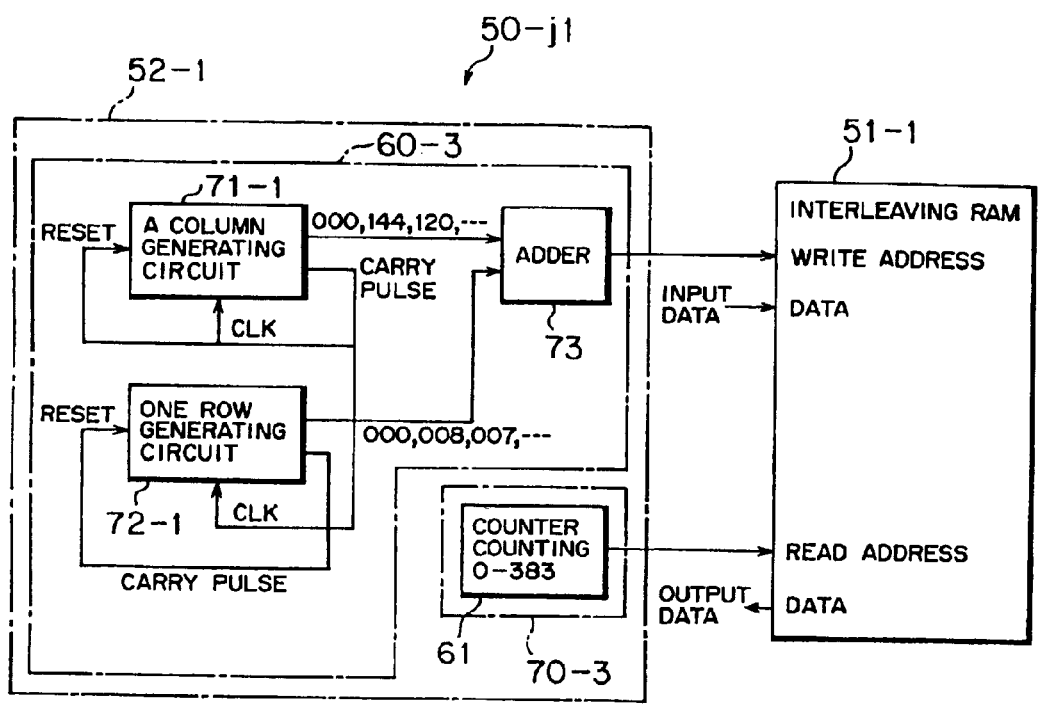
FIG. 16 is a block diagram showing a structure of an interleaving unit according to the first modification of the first embodiment of this invention.

In the MS 50-1 and the BS 100-1, it is alternatively possible to replace the interleaving unit 50-*j* randomly generating a read address to be used to read data from the first RAM 51 in interleaving with an interleaving unit 50-*j*1 as shown in FIG. 16 randomly generating a write address used to write data in the first RAM 51-1.

In such case, the interleaved data is de-interleaved using the de-interleaving unit 50-*d* according to the first embodiment.

The interleaving unit 15-1 comprises, as shown in FIG. 16, a first RAM 51-1 and a control processing unit 52-1.

The first RAM 51-1 stores data to be transmitted, similarly to the first RAM 51.

The control processing unit 52-1 performs a control on the first RAM 51-1 so that data to be transmitted is outputted from the first RAM 51-1 with the data to be transmitted arranged in a matrix and columns and rows thereof randomly rearranged, in a similar manner to the first control processing unit 52 according to the first embodiment.

To this end, the control processing unit 52-1 comprises, as shown in FIG. 16, a write processing unit 60-3 (hereinafter referred as "fourth write processing unit 60-3") and a read processing unit 70-3 (hereinafter referred as "fourth read processing unit 70-3).

The fourth read processing unit 70-3 functions in a similar manner to the second read processing unit 60-2 according to the first embodiment. The fourth read processing unit 70-3 performs a control to read data from the first RAM 51-1, and comprises a counter 61.

The fourth write processing unit (first write control unit) 60-3 performs a control on the first RAM 51-1 so that data to be transmitted is outputted from the first RAM 51-1 with the data to be transmitted arranged in a matrix and columns and rows thereof randomly rearranged.

To this end, the fourth write processing unit 60-3 comprises an A column generating circuit 71-1, a one row generating circuit 72-1 and an adder 73.

The A column generating circuit 71-1 and the one row generating circuit 72-1 of the interleaving unit 50-$j1$ may be configured in a similar way to the A column generating circuit 71 and the one row generating circuit 72 shown in FIG. 11, respectively. However, the first selecting circuit 71-$a$ selects a multiple of "24", and the fourth selecting circuit 72-$a$ outputs a pulse signal when the value falls within "0–23".

The de-interleaving unit 50-$d$ randomly rearranges columns and rows of data interleaved by the interleaving unit 50-$j1$, and reads the data in the order before the interleaved data was interleaved. A combination of the interleaving unit 50-$j1$ and the de-interleaving unit 50-$d$ can readily prevent degradation of the transmission quality as well even if burst errors generate during transmission.

(b1-2) Description of a Second Modification of the First Embodiment

Next, description will be made of a second modification of the first embodiment with reference to FIG. 5. An MS 50-2 and a BS 100-2 according to the second modification of the first embodiment have similar functions to the MS 50 and the BS 100 according to the first embodiment, respectively. Differently from the MS 50 and the BS 100 according to the first embodiment, the structure of the interleaving unit 50-$j$ according to the first embodiment shown in FIG. 10 and the structure of the de-interleaving unit 50-$d$ according to the first embodiment shown in FIG. 13 are exchanged to each other to form an interleaving unit 50-$j_2$ and a de-interleaving unit 50-$d_2$.

In the description of the second modification of the first embodiment, like reference characters designate like or corresponding parts in the first embodiment.

The de-interleaving unit 50-$d_2$ is configured in a similar manner to the interleaving unit 50-J, as shown in FIG. 10.

The interleaving unit 50-$j_2$ is configured in a similar manner to the de-interleaving unit 50-$d$, as shown in FIG. 13. The second RAM 53 shown in FIG. 13 stores input data sent from the error correction encoding unit 50-$i$ under a control of the second write processing unit 60-1, and outputs the data held therein to the signal assembling unit 50-$k$ under a control of the second read processing unit 70-1.

In the MS 50-2 and the BS 100-2 with the foregoing structures, even if data transmitted from the MS 50-2 to the BS 100-2 is affected by fading that errors are generated in the transmitted data, the MS 50-2 on the transmitting side randomly rearranges columns and rows of the data to be transmitted when transmitting, and the BS 100-2 on the receiving side rearranges the data in the order before the interleaved data was interleaved when receiving the interleaved data, in a similar way to the MS 50 and the BS 100 according to the first embodiment.

Accordingly, even if burst errors generate in 384 of data randomly rearranged on the transmitting side during transmission, the receiving side reforms the data into a readily correctable form to randomly distribute the errors, thereby readily correcting the errors, which prevents degradation of the transmission quality.

Incidentally, the above is the same even when the structures of the de-interleaving unit 50-$d1$ and the interleaving unit 50-$j$ according to the first modification of the first embodiment are exchanged, or structures of the interleaving unit 50-$j1$ and the de-interleaving unit 50-$d$ are exchanged.

(b2) Description of a Second Embodiment

Next, description will be made of a second embodiment with reference to FIG. 5. An MS 50-3 and a BS 100-3 shown in FIG. 5 according to the second embodiment have similar functions to the MS 50 and the BS 100 according to the first embodiment, respectively. However, the BS 50-3 and the BS 100-3 are different from those according to the first embodiment in a point that each of the A column generating circuit 71 and the one row generating circuit 72 in the de-interleaving unit 50-$d$ and the interleaving unit 50-$j$ according to the first embodiment is configured with a ROM and a counter.

In the description of the second embodiment, like reference characters designate like or corresponding parts in the above first embodiment.

Figure 17:
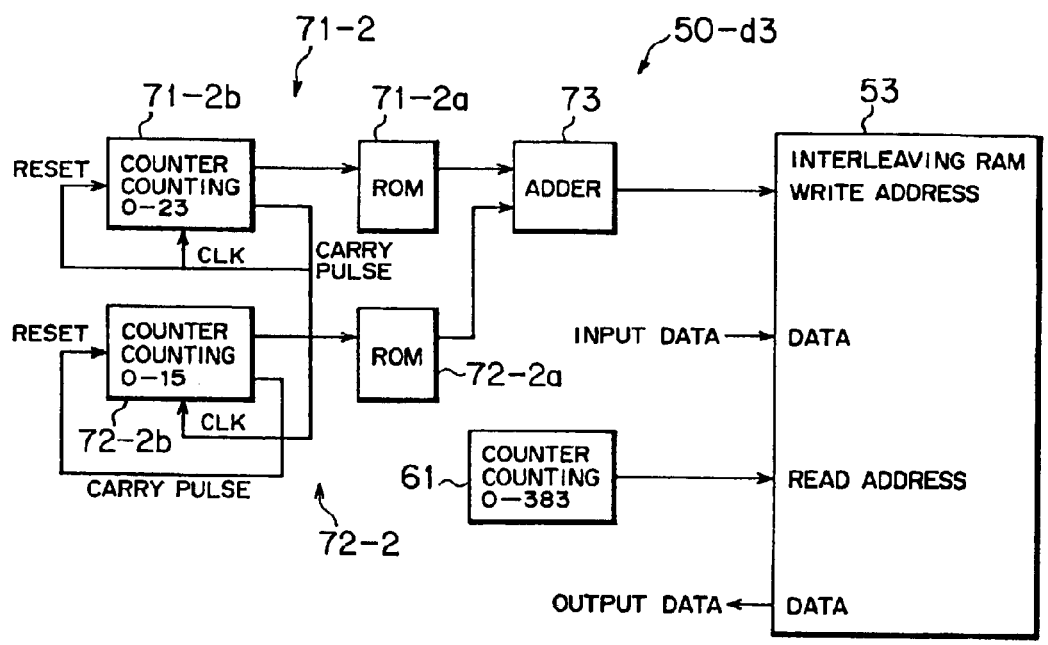
FIG. 17 is a block diagram showing a de-interleaving unit according to a second embodiment of this invention.

FIG. 17 is a block diagram showing a de-interleaving unit according to the second embodiment. As shown in FIG. 17, a de-interleaving unit 50-$d_3$ comprises an A column generating circuit 71-2 and a one row generating circuit 72-2 along with a second RAM 53, an adder 73 and a counter 61, similar to those of the de-interleaving unit 50-$d$ according to the first embodiment.

The A column generating circuit 71-2 comprises a similar function to the A column generating circuit 71 according to the first embodiment, but has a ROM (Read Only Memory) 71-2$a$ and a counter 71-2$b$, as shown in FIG. 17. The ROM (memory) 71-2$a$ holds 24 numbers (refer to FIG. 8) in the A column in predetermined addresses, respectively. Table 3 below shows an example of data held in the ROM 71-2$a$.

TABLE 3

| | Example of held data | | | | | | | | | | | |
|---|---|---|---|---|---|---|---|---|---|---|---|---|
| Address | 0 | 1 | 2 | 3 | 1 | 5 | 6 | 7 | ... | 20 | 21 | 22 | 23 |
| Data | 000 | 240 | 288 | 144 | 256 | 128 | 064 | 032 | ... | 224 | 112 | 304 | 368 |

The first RAM 51 shown in FIG. 10 stores input data sent from the data extracting unit 50-$c$, and outputs the data held therein to the error correction decoding unit 50-$e$ under a control of the first read processing unit 70.

As shown in Table 3 above, the ROM 71-2$a$ holds 24 numbers in column A shown in FIG. 8 in the descending order. For example, a number "256" is held in an address "4". When the ROM 71-2$a$ receives a count value (address in Table 3 above) outputted from the counter 71-2$b$, the ROM 71-2*a* reads data held in that address, and outputs the data to the adder 73.

The counter 71-2*b* is a free-running counter, which counts from "0" to "23", outputs a count value as a read address for the ROM 71-2*a*, and again counts from "0" when the count value reaches a maximum count value "23". The counter 71-2*b* sends a carry pulse to the counter 72-2*b* (to be described later) when a count cycle takes a round.

On the other hand, the one row generating circuit 72-2 has a similar function to the one row generating circuit 72 according to the first embodiment, but comprises a ROM 72-2*a* and a counter 72-2*b*, as shown in FIG. 17. The ROM (memory) 72-2*a* holds 16 numbers (refer to FIG. 8) in one row at predetermined addresses, respectively. Table 4 below shows an example of data held in the ROM 72-2*a*.

TABLE 4

Example of held data

| Address | 0 | 1 | 2 | 3 | 4 | 5 | 6 | 7 | ... | 12 | 13 | 14 | 15 |
|---|---|---|---|---|---|---|---|---|---|---|---|---|---|
| data | 000 | 015 | 009 | 006 | 004 | 002 | 001 | 012 | ... | 010 | 005 | 014 | 007 |

As shown in Table 4 above, the ROM 72-2*a* holds 16 number in one row shown in FIG. 8 in order, from left to right. For example, a number "008" is held in an address "3". When the ROM 72-2*a* receives a count value (address in Table 4 above) outputted from the counter 72-2*b*, the ROM 72-2*a* reads data held in that address and outputs the data to the adder 73.

The counter 72-2*b* counts from "0" to "15", outputting a count value as a read address for the ROM 72-2*a* and again counting from "0" when the count value reaches a maximum count value "15". Incidentally, the counter 72-2*b* counts up by receiving a carry pulse from the counter 71-2*b* in the A column generating circuit 71-2.

Write addresses outputted from the adder 73 shown in FIG. 13 are the same as those in the example shown in Table 1.

Figure 18:
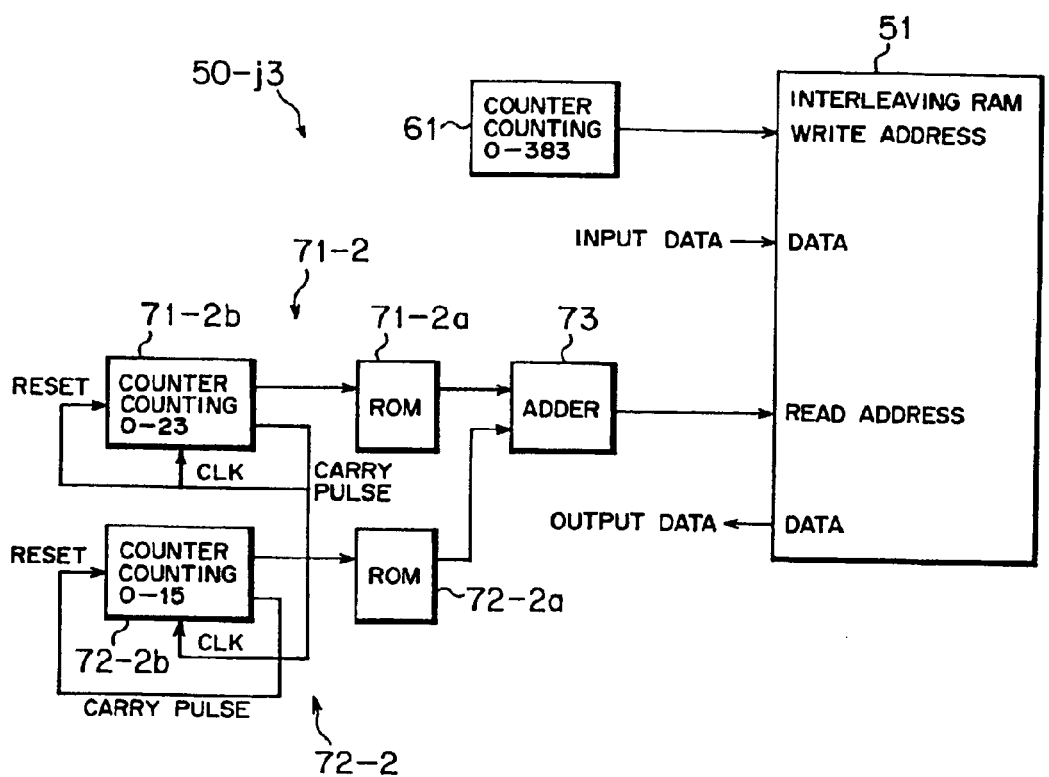
FIG. 18 is a block diagram showing an interleaving apparatus according to the second embodiment of this invention.

FIG. 18 is a block diagram showing an interleaving unit according to the second embodiment. As shown in FIG. 18, an interleaving unit 50-$j_3$ comprises an A column generating circuit 71-2 and a one row generating circuit 72-2 along with a first RAM 51, an adder 73 and a counter 61 similar to those of the interleaving unit 50-*j* according to the first embodiment.

According to the MS 50-3 and the BS 100-3 with the above structures according to the second embodiment, when the MS 50-3 transmits data to the BS 100-3, the interleaving unit 50-$j_3$ of the MS 50 randomly shuffles columns and rows of the data to be transmitted, and sends the interleaved data in the order as shown in FIG. 9 to the signal assembling unit 50-*k*, in a similar manner to the MS 50 and the BS 100 according to the first embodiment.

In interleaving, the interleaving unit 50-*j*3 reads data stored in the first RAM 51 using a value obtained by adding data (refer to foregoing Tables 3 and 4) sent from ROM 71-2*a* and the ROM 72-2*a* by the adder 73 as a read address to randomly read 384 of data (000–383).

After that, the interleaved data is sent to the BS 100-3 via the spreader 50-1, etc.

The BS 100-3 receives the data sent from the MS 50-1 via the de-spreader 50-*b*, etc., de-interleaves the data by the de-interleaving unit 50-*d*3, and sends the data in the order before the interleaved data was interleaved to the error correction decoding unit 50-*e*.

In de-interleaving, the de-interleaving unit 50-*d*3 reads data stored in the second RAM 53 using a value obtained by adding data (refer to foregoing Tables 3 and 4) sent from the ROM 71-2*a* and the ROM 72-2*a* as a write address to randomly write 384 of data in the second RAM 53. After writing the data in the second RAM 53, the de-interleaving unit 50-$d_3$ performs a control to read the 384 of data in order, beginning with a count value "0" of the counter 61.

According to the MS 50-3 and the BS 100-3 with the above structures, it is possible in random generation to readily set an order or the like in which 26 numbers in column A and 16 numbers in one row are to be generated, which becomes a reference for address generation, using the ROMs 71-2*a* and 72-2*a*, and certainly rearrange 384 of data (000–383), in addition to the effects described in the first embodiment, thereby preventing degradation of the transmission quality.

(b2-1) Description of a Modification of the Second Embodiment

Next, description will be made of a modification of the second embodiment with reference to FIG. 5. An MS 50-4 and a BS 100-4 according to the modification of the second embodiment shown in FIG. 5 have similar functions to the MS 50-3 and the BS 100-3 according to the second embodiment, respectively, but are different from those according to the second embodiment in a point that a ROM is used to randomly generate an address when data is interleaved or de-interleaved, unlike the de-interleaving unit 50-*d*3 and the interleaving unit 150-*j*3 according to the second embodiment.

In the description of the modification of the second embodiment, like reference characters designate like or corresponding parts in the second embodiment.

Each of the MS 50-4 and the BS 100-4 comprises a de-interleaving apparatus 50-*d*1 according to the first modification of the first embodiment in lieu of the de-interleaving unit 50-*d*3 according to the second embodiment.

In the MS 50-4 and the BS 100-4 with the above structures, it is possible to randomly rearrange columns and rows of data to be transmitted to form interleaved data as shown in FIG. 9 on the transmitting side, and randomly rearrange columns and rows of the interleaved data and send the data in the order before the interleaved data was interleaved to the error correction encoding unit 50-*e* on the receiving side, in a similar manner to the first and second embodiments. Even if burst errors generate during transmission, it is thereby possible to prevent degradation of the transmission quality by distributing errors such that the errors can be readily corrected. In addition, use of the ROMs 71-2*a* and 72-2*a* in random generation facilitates easy setting of an order or the like in which 24 numbers in column A and 16 numbers in one row are to be generated, which becomes a reference for address generation, thereby certainly rearranging 384 of data (000–383), which leads to prevention against degradation of the transmission quality.

Each of the MS 50-4 and the BS 100-4 may be provided with the interleaving apparatus 50-*j*1 according to the first modification of the first embodiment in lieu of the interleaving unit 50-*j*3 according to the second embodiment. In such case, it is possible to prevent degradation of the transmission quality, as well. In addition, the random generation on the receiving side can be readily realized using the ROMs 71-2*a* and 72-2*a*.

(b₃) Others

The above description has been made by way of CDMA communication. However, the present invention can be carried out in a similar manner as far as other radio communication has a function of correcting an error by using an error correcting code.

In the above description, the interleaving unit 50-*j* interleaves data to which an error correcting code is added in the error correction encoding unit 50-*i*. However, the error correction encoding unit 50-*i* may have a function of interleaving when a turbo code is used as the error correcting code. Incidentally, a turbo code is a code in combination of a convolution code, a BCH code, a Reed-Solomon code and interleaving.

Figure 19:
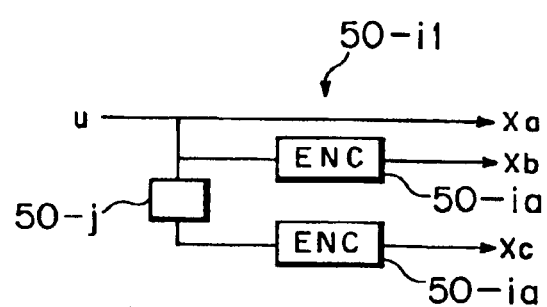
FIG. 19 is a block diagram showing an error correction encoding unit having an interleaving function according to another embodiment of this invention.

For example, FIG. 19 is a diagram showing an error correction encoding unit 50-*i*1 having an interleaving function. The error correction encoding unit 50-*i*1 shown in FIG. 19 comprises an interleaving unit 50-*j* and encoding apparatus 50-*ia*.

The encoding apparatus 50-*ia* (designated as "ENC" in the drawing) performs convolution or the like.

When data u is inputted to the error correction encoding unit 50-*i*1 shown in FIG. 19, the data $\mu$ is formed into three signals $X_a$, $X_b$, and $X_c$ through the encoding apparatus 50-*ia*, the interleaving unit 50-*j*, etc. The data $X_a$, $X_b$, and $X_c$ are sent to the interleaving unit 50-*j*, interleaved, respectively, and transmitted to the outside via the spreader 50-1, etc.

Figure 20:
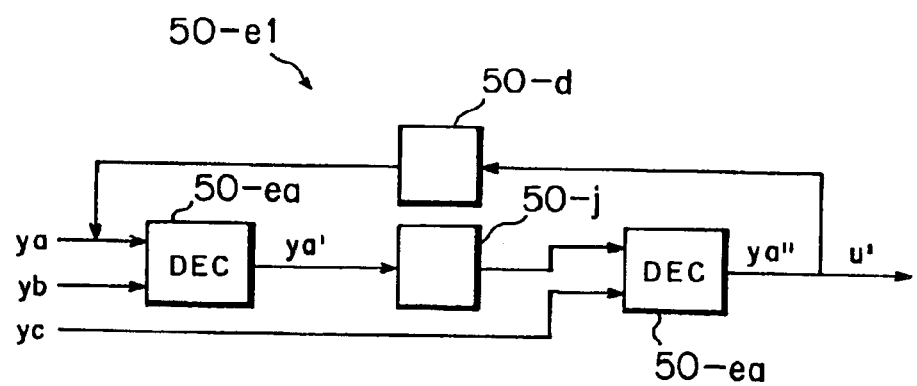
FIG. 20 is a block diagram showing an error correction decoding unit having an interleaving function and a de-interleaving function according to another embodiment of this invention.

On the other hand, data $y_a$, $Y_b$, and $y_c$ on the receiving side (assuming that $X_a$, $X_b$, and $X_c$ are modified into $y_a$, $y_b$, and $y_c$, respectively, by an effect of fading during transmission) is sent to the error correction decoding unit 50-*e*1 shown in FIG. 20.

The error correction decoding unit 50-*e*1 comprises, as shown in FIG. 20, decoding apparatus 50-*ea*, an interleaving unit 50-*j* and a de-interleaving unit 50-*d*.

The decoding apparatus 50-*ea* performs convolution decoding and the like.

In the error correction decoding unit 50-*e*1, a degree of correlation among the data $y_a$, $Y_b$, and $y_c$ is decreased, and the data whose error rate is decreased is sent to the error detecting unit 50-*f*. In concrete, the interleaving unit 50-*j* interleaves data $y_a'$ obtained by decoding the data $y_a$ and $Y_b$. Data $y_a''$ obtained by decoding the interleaved data and the data $y_c$ is further de-interleaved.

The error correction decoding unit 50-*e*1 performs a processing similar to decoding or the like with the data de-interleaved by the de-interleaving unit 50-*d* and the data $y_b$, and outputs decoded data u' whose correlation has been decreased.

As above, with a turbo code, it is possible to improve a weight distribution of the turbo code.

Alternatively, it is possible to separately rearrange the columns and rows shown in FIGS. 6 through 8.

Figure 21:
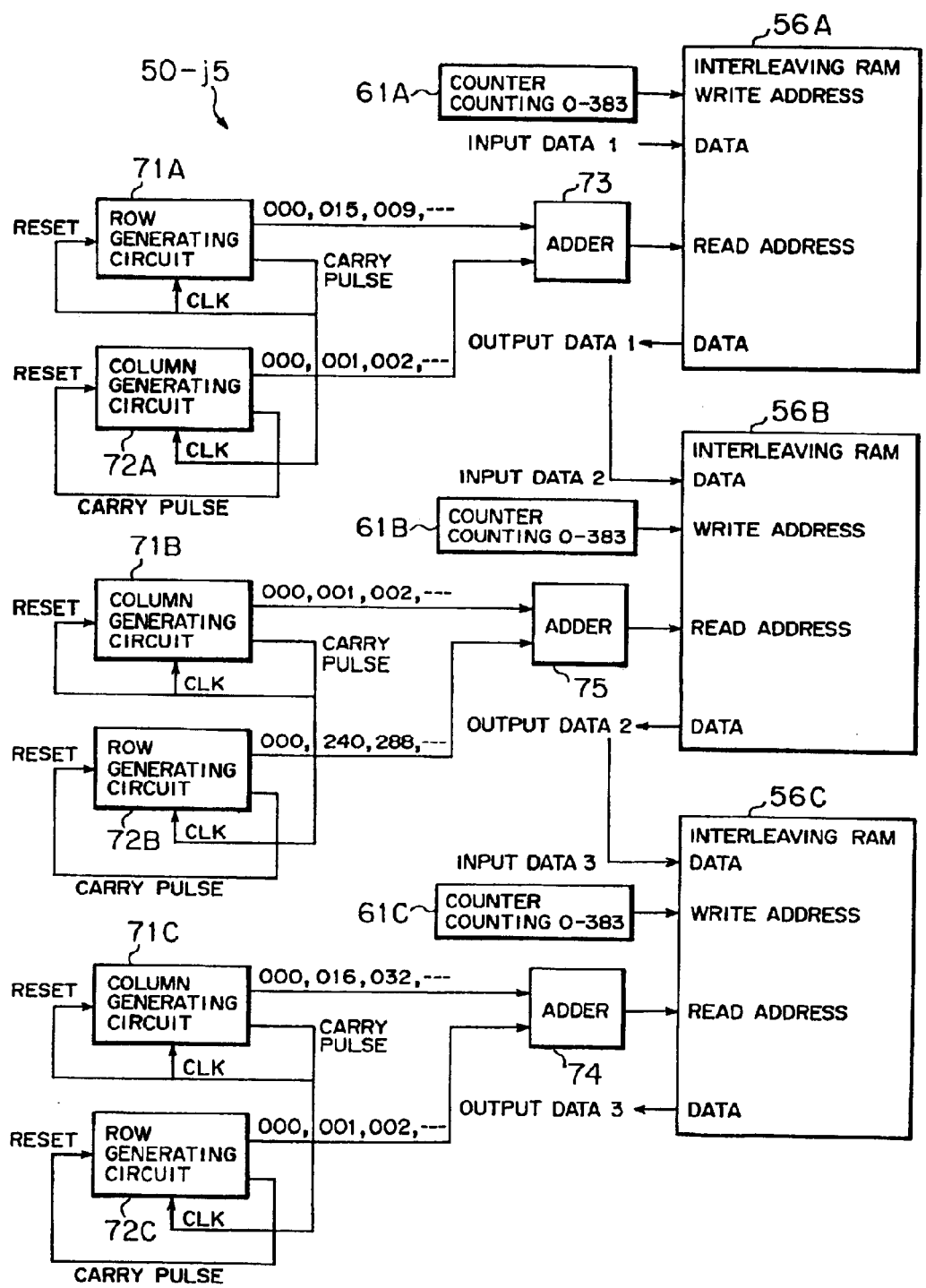
FIG. 21 is a block diagram showing an interleaving unit according to still another embodiment of this invention.

FIG. 21 is a block diagram showing an interleaving unit 50-*j*5. The interleaving unit 50-*j*5 comprises interleaving RAMS 56A through 56C, counters 61A through 61C, adders 73 through 75, row generating circuits 71A, 72B and 72C, and column generating circuits 72A, 71B and 71C.

Each of the interleaving RAMs (first storing unit) 56A through 56C is similar to the first RAM 51, which stores data to be transmitted.

Each of the row generating circuit 71A and the column generating circuits 71B and 71C has a similar function to the A column generating circuit, which outputs a different number at each timing to the adder. The row generating unit 71A outputs 16 numbers in one row shown in FIG. 7. The column generating circuit 71B generates numbers (000–015) in order, beginning with "000". The column generating circuit 71C generates "000" and multiples of 16 among numbers (000–368) in order, beginning with "000" up to "368".

Each of the column generating circuit 72A and the row generating circuits 72B and 72C has a similar function to the one row generating circuit 72. The column generating circuit 72A generates numbers (000–015) in order, beginning with "000". The row generating circuit 72B generates 24 numbers in column A shown in FIG. 8 in the descending order. The row generating circuit 72C generates numbers (000–015) in order, beginning with "000".

Each of the column generating circuit 72A and the row generating circuits 72B and 72C varies a number to be outputted to the adder 73 with reception of a carry pulse from the corresponding row generating circuit 71A, the column generating circuit 71B or 71C as an opportunity.

The interleaving apparatus 50-*j*5 shown in FIG. 21 rearranges the data (000–383) as shown in FIGS. 6 through 8, so that the data is arranged in the order shown in FIG. 9.

FIGS. 25 through 32 are diagrams for illustrating interleaving (24[4[2×2]×6[3×2]]×16[4[[2×2]×4[2×2]]]). Hereinafter, description will be made of interleaving (24[4 [2×2]×6[3×2]]×16[4[[2×2]×4[2×2]]]). 384 of data are arranged in a matrix of 24 rows by 16 columns as shown in FIG. 25.

Interleaving rearranges 16 columns in the order shown in FIG. 25 (1–16 shown in FIG. 25). FIG. 26 is a diagram showing a state where the 384 of data are arranged after the columns thereof shown in FIG. 25 are rearranged.

16 columns of the 384 of data are then divided into 4 groups, and the groups each consisting of 4 columns are rearranged in the order numbered (1–4 in FIG. 26). FIG. 27 is a diagram showing a state where the 384 of data whose columns shown in FIG. 26 have been rearranged.

The 384 of data whose 16 columns have been divided into 4 groups are rearranged in each group consisting of 4 columns in the order numbered (1–4 shown in FIG. 27). FIG. 28 is a diagram showing a state in which the 384 of data whose columns have been rearranged are arranged.

Next, 24 rows of the 384 of data are rearranged in the order numbered as shown in FIG. 28 (1–24 shown in FIG. 28). FIG. 29 is a diagram showing a state where the 384 of data are arranged after the rows thereof have been rearranged.

Further, the 24 rows of the 384 data are divided into 6 groups, and the rows in each group are rearranged in the order numbered (1–6 shown in FIG. 29). FIG. 30 is a diagram showing a state where the 384 of data whose rows shown in FIG. 29 have been rearranged are arranged.

The 384 of data are then divided in to 6 groups as shown in FIG. 30, and rearranged in each group consisting of 4 rows in the order numbered (1–4 shown in FIG. 30). FIG. 31 is a diagram showing a state where the 384 of data whose rows shown in FIG. 30 have been rearranged are arranged.

The 384 of data are read out in the direction of column as "000", "192", "096", "288", "032", "224" "128" and so on. When 24 of data in one column are completed, the data are again read out in the direction of row, beginning with the head of the column on the right.

For example, when reading of the last "368" in the column including "000" shown in FIG. 31 is completed, "008" at the head of the column on the right is next read out.

FIG. 32 is a diagram showing a state where interleaved 368 of data are arranged. The interleaved 368 of data shown in FIG. 32 are arranged, beginning with "000", in a direction from left to right, the data "368" shown at the right end is followed by "008", "376" is followed by "004", and so on.

The above interleaving (24[4[2×2]×6[3×2]]×16[4[[2×2]× 4[2×2]]) can be readily carried out using the above A column generating circuit 71 or the like, and the above one row generating circuit 72 or the like.

For example, the A column generating circuit 71 or the like is so configured as to generate 24 numbers ("000", "192", "096", "288", "032", "224", "128", "320", "064", "256", "160", "352", "016", "208", "112", "304", "048", "240", "144", "336", "080", "272", "176" and "386" in the order generated) in column A' shown in FIG. 31.

The one row generating circuit 72 or the like is so configured as to generate 16 numbers ("000", "008", "004", "012", "002", "010", "006", "014", "001", "009", "005", "013", "003", "011", "007" and "015" in the order generated) in row 1' shown in FIG. 31.

Meanwhile, the present invention can perform not only the above interleaving (24[4[2×2]×6[3×2]]×16[4[[2×2]×4 [2×2]]), but also (20[4[2×2]×5[3×2]]×16[4 [[2×2]×4[2×2]]) or the like.

The above description has been made by way of example where columns and rows are randomly shuffled. However, it is alternatively possible to randomly shuffle either columns or rows to rearrange data.

Further, the above description has been made by way of example where the ROM 71-2a or the like is used as a memory. However, it is alternatively possible to use another storage element as the memory.

Note that the present invention is not limited to the above examples, but may be modified in various ways without departing from the scope of the invention.

What is claimed is:

1. An interleaving method interleaving input data received in a time series comprising the steps of:

storing the input data in a storing unit;

outputting said stored data, the output data in an order different from an order of the input data; and controlling by a control unit the storing and outputting steps causing the output data order to be representative of arranging the input data in a matrix, interchanging rows of the matrix according to a predetermined order, each row representing a set of data pieces of said data thereby rearranging the rows without changing the order of the set of data pieces in each row, and interchanging columns of the matrix according to a predetermined order, each column representing a set of data pieces of said data thereby rearranging the columns without changing the order of the set of data pieces in each column, and causing the outputting of said rearranged data in time series, wherein the predetermined order provides for each rearranged row to be adjacent to different rows than were adjacent to each row at each row's original position and the predetermined order provides for each rearranged column to be adjacent to different columns than were adjacent to each column at each column's original position.

2. A de-interleaving method de-interleaving interleaved data received in a time series comprising the steps of:

storing said interleaved data in a storing unit;

outputting said stored data, the output data in an order the same as before the data was interleaved; and controlling by a control unit the storing and outputting steps causing the output data order to be representative of arranging the interleaved data in a matrix, interchanging rows of the matrix according to a predetermined order, each row representing a set of data pieces of said data thereby rearranging the rows without changing the order of the set of data pieces in each row, and interchanging columns of the matrix according to a predetermined order, each column representing a set of data pieces of said data thereby rearranging the columns without changing the order of the set of data pieces in each column, and causing the outputting of said rearranged data in time series, wherein the predetermined order provides for each rearranged row to be adjacent to different rows than were adjacent to each row at each row's original position and the predetermined order provides for each rearranged column to be adjacent to different columns than were adjacent to each column at each column's original position.

3. An interleaving apparatus for interleaving data to be transmitted, comprising:

a storing unit for storing data to be transmitted; and a control unit for controlling said storing unit so that said data to be transmitted is output from said storing unit in a rearranged order, the rearranged order representative of arranging the data to be transmitted in a matrix, interchanging rows of the matrix according to a predetermined order, each row representing a set of data pieces of said data thereby rearranging the rows without changing the order of the set of data pieces in each row, and interchanging columns of the matrix according to a predetermined order, each column representing a set of data pieces of said data thereby rearranging the columns without changing the order of the set of data pieces in each column, wherein the predetermined order provides for each rearranged row to be adjacent to different rows than were adjacent to each row at each row's original position and the predetermined order provides for each rearranged column to be adjacent to different columns than were adjacent to each column at each column's original position.

4. The interleaving apparatus according to claim 3, wherein said control unit including a write control unit for generating a write address to be used to write said data to be transmitted into said storing unit, said write control unit generating a sequence of write addresses causing the data to be transmitted to be stored in said storing unit representative of having said data to be transmitted arranged in a matrix rearranged by interchanging rows of the matrix according to the predetermined order, and by interchanging columns of the matrix according to the predetermined order, and for writing said data to be transmitted in said storing unit, and said control unit reads said data to be transmitted stored in said storing unit in the order of addresses.

5. The interleaving apparatus according to claim 4, wherein said write control unit including a column number generating unit generating column numbers and a row number generating unit generating row numbers, and said write control unit writes said data to be transmitted in said storing unit with numbers generated by said column number generating unit and said row number generating unit as said write address to write said data to be transmitted in said storing unit.

6. The interleaving apparatus according to claim 5, wherein each of said column number generating unit and said row number generating unit is configured with a memory for holding numbers used as addresses in a predetermined order.

7. The interleaving apparatus according to claim 3, wherein said control unit writes said data to be transmitted in said storing unit in the order of addresses, and said control unit including a read control unit for generating a read address to be used to read said data to be transmitted from said storing unit, said read control unit generating a sequence of read addresses causing the data to be transmitted to be read from said storing unit in an order representative of having said data to be transmitted arranged in a matrix and rearranged by interchanging rows of the matrix according to the predetermined order, and by interchanging columns of the matrix according to the predetermined order, said data to be transmitted.

8. The interleaving apparatus according to claim 7, wherein said read control unit including a column number generating unit generating column numbers and a row number generating unit generating row numbers, and said read control unit reads said data to be transmitted from said storing unit with numbers generated by said column number generating unit and said row number generating unit as said read address.

9. The interleaving apparatus according to claim 8, wherein each of said column number generating unit and said row number generating unit is configured with a memory for holding numbers used as addresses in a predetermined order.

10. A de-interleaving apparatus for de-interleaving received data, comprising:
   a storing unit for storing said received data; and
   a control unit for controlling said storing unit so that said received data is output from said storing unit in a state before said received data was interleaved, the controlling said storing unit representative of arranging said received data in a matrix and rearranging said received data by interchanging rows of the matrix according to a predetermined order, each row representing a set of data pieces of said data thereby rearranging the rows without changing the order of the set of data pieces in each row, and by interchanging columns of the matrix according to a predetermined order, each column representing a set of data pieces of said data thereby rearranging the columns without changing the order of the set of data pieces in each column,
   wherein the predetermined order provides for each rearranged row to be adjacent to different rows than were adjacent to each row at each row's original position and the predetermined order provides for each rearranged column to be adjacent to different columns than were adjacent to each column at each column's original position.

11. The de-interleaving apparatus according to claim 10, wherein said control unit including a write control unit for generating a write address to be used to write said received data into said storing unit in a state before said received data was interleaved, said write control unit generating a sequence of write addresses causing said received data to be stored in said storing unit representative of arranging said received data in a matrix and rearranging said received data by interchanging rows of the matrix according to the predetermined order and by interchanging columns of the matrix according to the predetermined order to write said received data, and said control unit reads said received data stored in said storing unit in the order of addresses.

12. The de-interleaving apparatus according to claim 11, wherein said write control unit including a column number generating unit generating column numbers and a row number generating unit generating row numbers, and said write control unit writes said data in said storing unit with numbers generated by said column number generating unit and said row number generating unit as a write address.

13. The de-interleaving apparatus according to claim 12, wherein each of said column number generating unit and said row number generating unit is configured with a memory for holding numbers used as addresses in a predetermined order.

14. The de-interleaving apparatus according to claim 10, wherein said control unit writes said received data in said storing unit in the order of addresses, and said control unit has a read control unit for generating a read address to be used to read said received data in a state before said received data was interleaved from said storing unit, said read control unit generating a sequence of read addresses causing the stored data to be read from said storing unit in an order representative of arranging said received data in a matrix and rearranging said received data by interchanging rows of the matrix according to the predetermined order and by interchanging columns of the matrix according to the predetermined order and for reading said received data from said storing unit.

15. The de-interleaving apparatus according to claim 14, wherein said read control unit including a column number generating unit generating column numbers and a row number generating unit generating row numbers, and said read control unit reads said received data from said storing unit with numbers generated by said column number generating unit and said row number generating unit as a read address.

16. The de-interleaving apparatus according to claim 15, wherein each of said column number generating unit and said row number generating unit is configured with a memory for holding numbers used as addresses in a predetermined order.

17. An interleaving/de-interleaving system comprising an interleaving apparatus for interleaving data to be transmitted and a de-interleaving apparatus for receiving said transmitted data interleaved by said interleaving apparatus to de-interleave said transmitted data,
   wherein said interleaving apparatus, comprising:
      a storing unit for storing data to be transmitted; and
      a control unit for controlling said storing unit so that said data to be transmitted is output from said storing unit in an order representative of having arranged said data to be transmitted in a matrix and rearranged by interchanging rows of the matrix according to a predetermined order, each row representing a set of data pieces of said data thereby rearranging the rows without changing the order of the set of data pieces in each row, and by interchanging columns of the matrix according to a predetermined order, each column representing a set of data pieces of said data thereby rearranging the columns without changing the order of the set of data pieces in each column,
      wherein the predetermined order provides for each rearranged row to be adjacent to different rows than were adjacent to each row at each row's original position and the predetermined order provides for each rearranged column to be adjacent to different columns than were adjacent to each column at each column's original position,
   and said de-interleaving apparatus, comprising:
      a storing unit for storing said received data; and
      a control unit for controlling said storing unit, thereby outputting said received data from said storing unit in a state before said transmitted data was interleaved, said control unit generating a sequence of write addresses causing said received data to be stored in said storing unit representative of arranging said received data in a matrix and rearranging said received data by interchanging rows of the matrix according to a predetermined order, each row representing a set of data pieces of said data thereby rearranging the rows without changing the order of the set of data pieces in each row, and by interchanging columns of the matrix according to a predetermined order, each column representing a set of data pieces of said data thereby rearranging the columns without changing the order of the set of data pieces in each column.

18. An interleaving apparatus for interleaving data to be transmitted, comprising:

a storing unit for storing data to be transmitted;

a control unit for controlling said storing unit so that said data to be transmitted is output from said storing unit in an order representative of having said data to be transmitted arranged in a matrix and rearranged by at least one of interchanging rows of the matrix according to a predetermined order, each row representing a set of data pieces of said data thereby rearranging the rows without changing the order of the set of data pieces in each row, and interchanging columns of the matrix according to a predetermined order, each column representing a set of data pieces of said data thereby rearranging the columns without changing the order of the set of data pieces in each column; and wherein said control unit including a write control unit for generating a write address to be used to write said data to be transmitted into said storing unit, said write control unit generating a sequence of write addresses causing the data to be transmitted to be stored in said storing unit representative of having said data to be transmitted arranged in a matrix and rearranged by at least one of interchanging rows of the matrix according to the predetermined order and interchanging columns of the matrix according to the predetermined order and for writing said data to be transmitted into said storing unit, and said control unit reads said data to be transmitted stored in said storing unit, and wherein the predetermined order provides for at least one of each rearranged row to be adjacent to different rows than were adjacent to each row at each row's original position and the predetermined order provides for each rearranged column to be adjacent to different columns than were adjacent to each column at each column's original position.

19. An interleaving apparatus for interleaving data to be transmitted, comprising:

a storing unit for storing data to be transmitted;

a control unit for controlling said storing unit so that said data to be transmitted is output from said storing unit in an order representative of having said data to be transmitted arranged in a matrix and rearranged by at least one of interchanging rows of the matrix according to a predetermined order, each row representing a set of data pieces of said data thereby rearranging the rows without changing the order of the set of data pieces in each row, and interchanging columns of the matrix according to another predetermined order, each column representing a set of data pieces of said data thereby rearranging the columns without changing the order of the set of data pieces in each column; and wherein said control unit including a write control unit for generating a write address to be used to write said data to be transmitted into said storing unit, said write control unit generating a sequence of write addresses causing the data to be transmitted to be stored in said storing unit representative of having said data to be transmitted arranged in a matrix and rearranged by at least one of interchanging rows of the matrix according to the predetermined order and interchanging columns of the matrix according to the other predetermined order and for writing said data to be transmitted into said storing unit so as to be read said data from said storing unit according to the order of addresses of said storing unit, and wherein the predetermined order provides for each rearranged row to be adjacent to different rows than were adjacent to each row at each row's original position and the other predetermined order provides for each rearranged column to be adjacent to different columns than were adjacent to each column at each column's original position.

20. The interleaving apparatus according to claim 18, wherein said control unit including a column number generating unit generating column numbers and a row number generating unit generating row numbers, and said write control unit writes said data to be transmitted in said storing unit with numbers generated by said column number generating unit and said row number generating unit as said write address to write said data to be transmitted in said storing unit.

21. The interleaving apparatus according to claim 20, wherein each of said column number generating unit and said row number generating unit is configured with a memory for holding numbers used as addresses in a predetermined order.

22. The interleaving apparatus according to claim 19, wherein said control unit including a column number generating unit generating column numbers and a row number generating unit generating row numbers, and said write control unit writes said data to be transmitted in said storing unit with numbers generated by said column number generating unit and said row number generating unit as said write address to write said data to be transmitted in said storing unit.

23. The interleaving apparatus according to claim 22, wherein each of said column number generating unit and said row number generating unit is configured with a memory for holding numbers used as addresses in a predetermined order.

24. An interleaving apparatus for interleaving data to be transmitted, comprising:

a storing unit for storing data to be transmitted;

a control unit for controlling said storing unit so that said data to be transmitted is output from said storing unit in an order representative of having said data to be transmitted arranged in a matrix and rearranged by at least one of interchanging rows of the matrix according to a predetermined order, each row representing a set of data pieces of said data thereby rearranging the rows without changing the order of the set of data pieces in each row, and interchanging columns of the matrix according to another predetermined order, each column representing a set of data pieces of said data thereby rearranging the columns without changing the order of the set of data pieces in each column; and wherein said control unit writes said data to be transmitted in said storing unit according to the order of addresses of said storing unit, and said control unit including a read control unit for generating a read address to be used to read said data to be transmitted from said storing unit, said read control unit generating a sequence of read addresses causing the data to be transmitted to be read from said storing unit in an order representative of having said data to be transmitted arranged in a matrix and rearranged by at least one of interchanging rows of the matrix according to the predetermined order and interchanging columns of the matrix according to the other predetermined order, and wherein the predetermined order provides for each rearranged row to be adjacent to different rows than were adjacent to each row at each row's original position and the other predetermined order provides for each rearranged column to be adjacent to different columns than were adjacent to each column at each column's original position.

25. The interleaving apparatus according to claim 24, wherein said read control unit including a column number generating unit generating column numbers and a row number generating unit generating row numbers, and said read control unit reads said data to be transmitted from said storing unit with numbers generated by said column number generating unit and said row number generating unit as said read address.

26. The interleaving apparatus according to claim 25, wherein each of said column number generating unit and said row number generating unit is configured with a memory for holding numbers used as addresses in a predetermined order.

27. An interleaving apparatus for interleaving data to be transmitted, comprising:
a storing unit for storing data to be transmitted;
a control unit for controlling said storing unit so that said data to be transmitted is output from said storing unit in an order representative of having said data to be transmitted arranged in a matrix and rearranged by at least one of interchanging rows of the matrix according to a row predetermined order, each row representing a set of data pieces of said data thereby rearranging the rows without changing the order of the set of data pieces in each row, and interchanging columns of the matrix according to a column predetermined order, each column representing a set of data pieces of said data thereby rearranging the columns without changing the order of the set of data pieces in each column; and
wherein said control unit including a read control unit for generating a read address to be used to read said data to be transmitted, said data to be transmitted stored in the order of addresses of said storing unit, from said storing unit, said read control unit generating a sequence of read addresses causing the data to be transmitted to be read from said storing unit in an order representative of having said data to be transmitted arranged in a matrix and rearranged by at least one of interchanging rows of the matrix according to the row predetermined order and interchanging columns of the matrix according to the column predetermined order, and
wherein the row predetermined order provides for each rearranged row to be adjacent to different rows than were adjacent to each row at each row's original position and the column predetermined order provides for each rearranged column to be adjacent to different columns than were adjacent to each column at each column's original position.

28. The interleaving apparatus according to claim 27, wherein said read control unit including a column number generating unit generating column numbers and a row number generating unit generating row numbers, and said read control unit reads said data to be transmitted from said storing unit with numbers generated by said column number generating unit and said row number generating unit as said read address.

29. The interleaving apparatus according to claim 28, wherein each of said column number generating unit and said row number generating unit is configured with a memory for holding numbers used as addresses in a predetermined order.

30. A de-interleaving apparatus for de-interleaving received data, comprising:
a storing unit for storing said received data;
a control unit for controlling said storing unit so that said received data is output from said storing unit in a state before said received data was interleaved, the controlling of said storing unit representative of arranging said received data in a matrix and rearranging said received data by interchanging rows of the matrix according to a predetermined order, each row representing a set of data pieces of said data thereby rearranging the rows without changing the order of the set of data pieces in each row, and by interchanging columns of the matrix according to another predetermined order, each column representing a set of data pieces of said data thereby rearranging the columns without changing the order of the set of data pieces in each column; and
wherein said control unit including a write control unit for generating a write address to be used to write said received data into said storing unit in a state before said received data was interleaved, said write control unit generating a sequence of write addresses causing said received data to be stored in said storing unit representative of arranging said received data in a matrix and rearranging said received data by interchanging rows of the matrix according to the predetermined order and by interchanging columns of the matrix according to the other predetermined order and to write said received data, and
wherein the predetermined order provides for each rearranged row to be adjacent to different rows than were adjacent to each row at each row's original position and the other predetermined order provides for each rearranged column to be adjacent to different columns than were adjacent to each column at each column's original position.

31. The de-interleaving apparatus according to claim 30, wherein said write control unit including a column number generating unit generating column numbers and a row number generating unit generating row numbers, and said write control unit writes said data to be transmitted in said storing unit with numbers generated by said column number generating unit and said row number generating unit as said write address to write said data to be transmitted in said storing unit.

32. The de-interleaving apparatus according to claim 31, wherein each of said column number generating unit and said row number generating unit is configured with a memory for holding numbers used as addresses in a predetermined order.

33. A de-interleaving apparatus for de-interleaving received data, comprising:
a storing unit for storing said received data;
a control unit for controlling said storing unit so that said received data is output from said storing unit in a state before said received data was interleaved, the controlling of said storing unit representative of arranging said received data in a matrix and rearranging said received data by at least one of interchanging rows of the matrix according to a predetermined order, each row representing a set of data pieces of said data thereby rearranging the rows without changing the order of the set of data pieces in each row, and interchanging columns of the matrix according to another predetermined order, each column representing a set of data pieces of said data thereby rearranging the columns without changing the order of the set of data pieces in each column; and
wherein said control unit including a write control unit for generating a write address to be used to write said received data into said storing unit, said write control unit generating a sequence of write addresses causing said received data to be stored in said storing unit representative of arranging said received data in a matrix and at least one of interchanging rows of the matrix according to the predetermined order and interchanging columns of the matrix according to the other predetermined order and for writing said received data in said storing unit so as to read said received data from said storing unit according to the order of addresses of said storing unit, and wherein the predetermined order provides for each rearranged row to be adjacent to different rows than were adjacent to each row at each row's original position and the other predetermined order provides for each rearranged column to be adjacent to different columns than were adjacent to each column at each column's original position.

34. The de-interleaving apparatus according to claim 33, wherein said write control unit including a column number generating unit generating column numbers and a row number generating unit generating row numbers, and said write control unit writes said data to be transmitted in said storing unit with numbers generated by said column number generating unit and said row number generating unit as said write address to write said data to be transmitted in said storing unit.

35. The de-interleaving apparatus according to claim 34, wherein each of said column number generating unit and said row number generating unit is configured with a memory for holding numbers used as addresses in a predetermined order.

36. A de-interleaving apparatus for de-interleaving received data, comprising:
    a storing unit for storing said received data;
    a control unit for controlling said storing unit so that said received data is output from said storing unit in a state before said received data was interleaved, the controlling of said storing unit representative of arranging said received data in a matrix and rearranging said received data by at least one of interchanging rows of the matrix according to a predetermined order, each row representing a set of data pieces of said data thereby rearranging the rows without changing the order of the set of data pieces in each row, and interchanging columns of the matrix according to another predetermined order, each column representing a set of data pieces of said data thereby rearranging the columns without changing the order of the set of data pieces in each column; and
    wherein said control unit writes said data to be transmitted in said storing unit according to the order of addresses of said storing unit, and said control unit including a read control unit for generating a read address to be used to read said received data from said storing unit, said read control unit generating a sequence of read addresses causing the received data to be read from said storing unit in an order representative of having said received data arranged in a matrix and rearranged by at least one of interchanging rows of the matrix according to the predetermined order and by interchanging columns of the matrix according to the other predetermined order to read said data to be transmitted, and
    wherein the predetermined order provides for each rearranged row to be adjacent to different rows than were adjacent to each row at each row's original position and the other predetermined order provides for each rearranged column to be adjacent to different columns than were adjacent to each column at each column's original position.

37. The de-interleaving apparatus according to claim 36, wherein said read control unit including a column number generating unit generating column numbers and a row number generating unit generating row numbers, and said read control unit reads said received data from said storing unit with numbers generated by said column number generating unit and said row number generating unit as a read address.

38. The de-interleaving apparatus according to claim 37, wherein each of said column number generating unit and said row number generating unit is configured with a memory for holding numbers used as addresses in a predetermined order.

39. A de-interleaving apparatus for de-interleaving received data, comprising:
    a storing unit for storing said received data;
    a control unit for controlling said storing unit so that said received data is output from said storing unit in a state before said received data was interleaved, the controlling said storing unit representative of arranging said received data in a matrix and rearranging said received data by interchanging rows of the matrix according to a predetermined order, each row representing a set of data pieces of said data thereby rearranging the rows without changing the order of the set of data pieces in each row, and by interchanging columns of the matrix according to a predetermined order, each column representing a set of data pieces of said data thereby rearranging the columns without changing the order of the set of data pieces in each column; and
    wherein said control unit including a read control unit for generating a read address to be used to read said received data written in said storing unit, from said storing unit, said read control unit generating a sequence of read addresses causing the received data to be read from said storing unit in an order representative of having said received data arranged in a matrix and rearranged by interchanging rows of the matrix according to the predetermined order, and by interchanging columns of the matrix according to the predetermined order, to read said data to be transmitted, and
    wherein the predetermined order provides for each rearranged row to be adjacent to different rows than were adjacent to each row at each row's original position and the other predetermined order provides for each rearranged column to be adjacent to different columns than were adjacent to each column at each column's original position.

40. The de-interleaving apparatus according to claim 39, wherein said read control unit including a column number generating unit generating column numbers and a row number generating unit generating row numbers, and said read control unit reads said received data from said storing unit with numbers generated by said column number generating unit and said row number generating unit as a read address.

41. The de-interleaving apparatus according to claim 40, wherein each of said column number generating unit and said row number generating unit is configured with a memory for holding numbers used as addresses in a predetermined order.

42. A transmitting apparatus with an interleaving function, comprising:
    an error detection encoding unit for encoding an error detecting bit and for adding said error detecting bit to data to be transmitted;
    an error correction encoding unit for adding an error correcting code, which is to be used for error correction, to said data to be transmitted, sent from said error detection encoding unit;

an interleaving unit which includes a storing unit for storing said data to be transmitted, from said error detection encoding unit, and a control unit for controlling said storing unit so that said data to be transmitted is output from said storing unit in an order representative of having said data to be transmitted arranged in a matrix and rearranged by at least one of interchanging rows of the matrix according to a predetermined order, each row representing a set of data pieces of said data thereby rearranging the rows without changing the order of the set of data pieces in each row, and by interchanging columns of the matrix according to another predetermined order, each column representing a set of data pieces of said data thereby rearranging the columns without changing the order of the set of data pieces in each column;

a signal assembling unit assembles interleaved data from said interleaving unit to form a signal format suited for transmission; and a spreading unit for converting the signal sent from said signal assembling unit into a spread signal using a predetermined spreading code, wherein the predetermined order provides for each rearranged row to be adjacent to different rows than were adjacent to each row at each row's original position and the other predetermined order provides for each rearranged column to be adjacent to different columns than were adjacent to each column at each column's original position.

43. The transmitting apparatus with a interleaving function according to claim 42, wherein said control unit including a write control unit for generating a write address to be used to write said data to be transmitted into said storing unit, said write control unit generating a sequence of write addresses causing the data to be transmitted to be stored in said storing unit representative of having said data to be transmitted arranged in a matrix and rearranged by at least one of interchanging rows of the matrix according to the predetermined order and interchanging columns of the matrix according to the other predetermined order and for writing said data to be transmitted into said storing unit, and said control unit reads said data to be transmitted stored in said storing unit according to the order of addresses of said storing unit.

44. The transmitting apparatus with a interleaving function according to claim 42, wherein said control unit writes said data to be transmitted into said storing unit according to the order of addresses of said storing unit, and said control unit including a read control unit for generating a read address to be used to read said data to be transmitted from said storing unit, said read control unit generating a sequence of read addresses causing the data to be transmitted to be read from said storing unit in an order representative of having said data to be transmitted arranged in a matrix and rearranged by at least one of interchanging rows of the matrix according to the predetermined order and interchanging columns of the matrix according to the other predetermined order.

45. A receiving apparatus with a de-interleaving function, comprising:

a de-spreading unit for separating a desired signal from a received signal using a de-spreading code;

a data extracting unit for extracting received data from the signal separated by the de-spreading unit;

a de-interleaving unit which includes a storing unit for storing said received data from said de-spreading unit, and a control unit for controlling said storing unit so that said received data is output from said storing unit in a state before said received data was interleaved, the controlling of said storing unit representative of arranging said received data in a matrix and rearranging said received data by at least one of interchanging rows of the matrix according to a predetermined order, each row representing a set of data pieces of said data thereby rearranging the rows without changing the order of the set of data pieces in each row, and interchanging columns of the matrix according to another predetermined order, each column representing a set of data pieces of said data thereby rearranging the columns without changing the order of the set of data pieces in each column;

an error correction decoding unit for decoding said received data de-interleaved by said de-interleaving unit, and for correcting an error included in said received data using an error correcting code; and an error detecting unit for detecting an error detecting bit added when said received data is transmitted on the basis of a bit structure of the error detecting bit previously set, wherein the predetermined order provides for each rearranged row to be adjacent to different rows than were adjacent to each row at each row's original position and the other predetermined order provides for each rearranged column to be adjacent to different columns than were adjacent to each column at each column's original position.

46. The receiving apparatus with a de-interleaving function according to claim 45, wherein said control unit including a write control unit for generating a write address to be used to write said received data into said storing unit in a state before said received data was interleaved, said write control unit generating a sequence of write addresses causing said received data to be stored in said storing unit representative of arranging said received data in a matrix and rearranging said received data by at least one of interchanging rows of the matrix according to the predetermined order and interchanging rows of the matrix according to the other predetermined order to write said received data, and said control unit reads said received data stored in said storing unit according to the order of addresses of said storing unit.

47. The receiving apparatus with a de-interleaving function according to claim 45, wherein said control unit writes said data to be transmitted into said storing unit according to the order of addresses of said storing unit, and said control unit including a read control unit for generating a read address to be used to read said received data from said storing unit, said read control unit generating a sequence of read addresses causing the received data to be read from said storing unit in an order representative of having said received data stored in said storing unit arranged in a matrix and rearranged by at least one of interchanging rows of the matrix according to the predetermined order and interchanging columns of the matrix according to the other predetermined order.

48. A transmitting and receiving apparatus with a interleaving and de-interleaving function, comprising:

an error detection encoding unit for encoding an error detecting bit and for adding said error detecting bit to data to be transmitted;

an error correction encoding unit for adding an error correcting code, which is to be used for error correction, to said data to be transmitted, sent from said error detection encoding unit;

an interleaving unit which includes a storing unit for storing said data to be transmitted, from said error detection encoding unit, and a first control unit for controlling said storing unit so that said data to be transmitted is output from said storing unit in an order representative of having said data to be transmitted arranged in a matrix and rearranged by at least one of interchanging rows of the matrix according to a predetermined order, each row representing a set of data pieces of said data thereby rearranging the rows without changing the order of the set of data pieces in each row, and interchanging columns of the matrix according to another predetermined order, each column representing a set of data pieces of said data thereby rearranging the columns without changing the order of the set of data pieces in each column;

a signal assembling unit assembles interleaved data from said interleaving unit to form a signal format suited for transmission;

a spreading unit for converting the signal sent from said signal assembling unit into a spread signal using a predetermined spreading code;

a duplexer for transmitting the spread signal from said spreading unit to an antenna;

a de-spreading unit for separating a desired signal from a received signal via said antenna and duplexer using a de-spreading code;

a data extracting unit for extracting received data from the signal separated by the de-spreading unit;

a de-interleaving unit which includes a storing unit for storing said received data from said de-spreading unit, and a second control unit for controlling said storing unit so that said received data is output from said storing unit in a state before said received data was interleaved, the controlling of said storing unit representative of arranging said received data in a matrix and rearranging said received data by at least one of interchanging rows of the matrix according to the predetermined order, each row representing a set of data pieces of said data thereby rearranging the rows without changing the order of the set of data pieces in each row, and interchanging columns of the matrix according to the other predetermined order, each column representing a set of data pieces of said data thereby rearranging the columns without changing the order of the set of data pieces in each column;

an error correction decoding unit for decoding said received data de-interleaved by said de-interleaving unit, and for correcting an error included in said received data using an error correcting code; and an error detecting unit for detecting an error detecting bit added when said received data is transmitted on the basis of a bit structure of the error detecting bit previously set, wherein the predetermined order provides for each rearranged row to be adjacent to different rows than were adjacent to each row at each row's original position and the other predetermined order provides for each rearranged column to be adjacent to different columns than were adjacent to each column at each column's original position.

49. The transmitting and receiving apparatus according to claim 48, wherein said first control unit including a write control unit for generating a write address to be used to write said data to be transmitted into said storing unit, said write control unit generating a sequence of write addresses causing the data to be transmitted to be stored in said storing unit representative of having said data to be transmitted arranged in a matrix and rearranged by at least one of interchanging rows of the matrix according to the predetermined order and interchanging columns of the matrix according to the other predetermined order and for writing said data to be transmitted into said storing unit, and said first control unit reads said data to be transmitted stored in said storing unit according to the order of addresses of said storing unit.

50. The transmitting and receiving apparatus according to claim 48, wherein said first control unit writes said data to be transmitted in said storing unit according to the order of addresses of said storing unit, and said first control unit including a read control unit for generating a read address to be used to read said data to be transmitted from said storing unit, said read control unit generating a sequence of read addresses causing the data to be transmitted to be read from said storing unit in an order representative of having said data to be transmitted arranged in a matrix and rearranged by at least one of interchanging rows of the matrix according to the predetermined order and interchanging columns of the matrix according to the other predetermined order.

51. The transmitting and receiving apparatus according to claim 48, wherein said second control unit including a write control unit for generating a write address to be used to write said received data into said storing unit in a state before said received data was interleaved, said write control unit generating a sequence of write addresses causing said received data to be stored in said storing unit representative of arranging said received data in a matrix and rearranging said received data by at least one of interchanging rows of the matrix according to the predetermined order and interchanging columns of the matrix according to the other predetermined order and said second control unit reads said received data stored in said storing unit according to the order of addresses of said storing unit.

52. The transmitting and receiving apparatus according to claim 48, wherein said second control unit writes said data to be transmitted into said storing unit according to the order of addresses of said storing unit, and said control unit including a read control unit for generating a read address to be used to read said data to be transmitted from said storing unit with said data to be transmitted stored in said storing unit arranged in a matrix and rearranged by at least one of interchanging rows of the matrix according to the predetermined order, and interchanging columns of the matrix according to the other predetermined order, to read said data to be transmitted.

53. An interleaving apparatus for interleaving input data received in a time series, comprising:

a storing unit storing the data as a matrix;

a control unit for writing the data in said storing unit in a row by row order and reading out the data in an order determined by at least one of interchanging columns according to a predetermined rule thereby rearranging the columns without changing the order of the data within each column and interchanging rows according to another predetermined rule thereby rearranging the rows without changing the order of the data within each row, and reading out the data column by column, wherein the predetermined rule provides for each rearranged column to be adjacent to different columns than were adjacent to each column at each column's original position and the other predetermined rule provides for each rearranged row to be adjacent to different rows than were adjacent to each row at each row's original position.

54. An interleaving apparatus for interleaving input data received in a time series, comprising:

a storing unit storing the data as a matrix;

a control unit for writing the data in said storing unit in a column by column order and reading out the data in an order determined by at least one of interchanging rows according to a predetermined rule thereby rearranging the rows without changing the order of the data within each row and interchanging columns according to another predetermined rule thereby rearranging the columns without changing the order of the data within each column, and reading out the data row by row, wherein the predetermined rule provides for each rearranged column to be adjacent to different columns than were adjacent to each column at each column's original position and the other predetermined rule provides for each rearranged row to be adjacent to different rows than were adjacent to each row at each row's original position.

55. An interleaving apparatus for interleaving input data received in a time series, comprising:

a storing unit storing the input data;

a control unit for writing the data into said storing unit and reading the data from said storing unit, and controlling the writing and reading of the data by arranging said storing unit addresses as a matrix, and writing the data to said storing unit in one of a row by row and column by column address order of said matrix, and reading out the data in an address order determined by interchanging the addresses of said matrix by at least one of columns and rows of said matrix according to a predetermined rule and reading by addresses of the rearranged matrix by one of column by column and row by row address order, wherein the predetermined rule provides for each rearranged column to be adjacent to different columns than were adjacent to each column at each column's original position and for each rearranged row to be adjacent to different rows than were adjacent to each row at each row's original position.

56. An interleaving apparatus for interleaving input data to be transmitted, comprising:

a storing unit for storing input data to be transmitted;

a control unit for controlling said storing unit so that said data to be transmitted is output from said storing unit in a predetermined order different from an order of the input data, wherein the predetermined order is determined by arranging addresses of said storing unit in a matrix and rearranging at least one of an order of the matrix columns according to column predetermined rule, each column representing a set of data pieces of said data thereby rearranging the columns without changing the order of the data within each column, and an order of the matrix rows according to row predetermined rule, each row representing a set of data pieces of said data thereby rearranging the rows without changing the order of the data within each row;

wherein the row predetermined order provides for each rearranged row to be adjacent to different rows than were adjacent to each row at each row's original position and the column predetermined order provides for each rearranged column to be adjacent to different columns than were adjacent to each column at each column's original position, wherein said control unit includes a write control unit for generating a write address to be used to write said data to be transmitted into said storing unit, said write address generated according to said matrix rearranged by at least one of interchanging rows of the matrix according to the row predetermined rule and interchanging columns of the matrix according to the column predetermined rule, and for writing said data to be transmitted into said storing unit, and wherein said control unit includes a read control unit for generating a read address to be used to read said data to be transmitted from said storing unit.

57. The interleaving apparatus of claim 56, wherein said read control unit generating a read addresses according to one of a row by row and column by column addresses of said matrix.

58. An interleaving apparatus for interleaving input data to be transmitted, comprising:

a storing unit for storing input data to be transmitted;

a control unit for controlling said storing unit so that said data to be transmitted is outputted from said storing unit in a predetermined order different from an order of the input data, wherein the predetermined order is determined by arranging addresses of said storing unit in a matrix and rearranging at least one of an order of the matrix columns according to a column predetermined rule, each column representing a set of data pieces of said data thereby rearranging the columns without changing the order of the data within each column, and an order of the matrix rows according to a row predetermined rule, each row representing a set of data pieces of said data thereby rearranging the rows without changing the order of the data within each row;

wherein the row predetermined order provides for each rearranged row to be adjacent to different rows than were adjacent to each row at each row's original position and the column predetermined order provides for each rearranged column to be adjacent to different columns than were adjacent to each column at each column's original position wherein said control unit includes a write control unit for generating a write address to be used to write said data to be transmitted in said storing unit, wherein said control unit includes a read control unit for generating a read address to be used to read said data to be transmitted from said storing unit, said read address generated according to said matrix rearranged by at least one of interchanging rows of the matrix according to the row predetermined rule, and interchanging columns of the matrix according to the column predetermined rule, and for reading said data to be transmitted from said storing unit.

59. The interleaving apparatus of claim 58, wherein said write control unit generating write addresses according to one of a row by row and column by column address of said matrix.

* * * * *